(12) United States Patent
Suzuki et al.

(10) Patent No.: US 10,501,271 B2
(45) Date of Patent: Dec. 10, 2019

(54) LOAD PORT

(71) Applicant: SINFONIA TECHNOLOGY CO., LTD., Minato-ku (JP)

(72) Inventors: Atsushi Suzuki, Minato-ku (JP); Yasushi Taniyama, Minato-ku (JP)

(73) Assignee: SINFONIA TECHNOLOGY CO., LTD., Minato-ku (JP)

( * ) Notice: Subject to any disclaimer, the term of this patent is extended or adjusted under 35 U.S.C. 154(b) by 0 days.

(21) Appl. No.: 15/750,376

(22) PCT Filed: Jul. 12, 2016

(86) PCT No.: PCT/JP2016/070568
§ 371 (c)(1),
(2) Date: Feb. 5, 2018

(87) PCT Pub. No.: WO2017/022432
PCT Pub. Date: Feb. 9, 2017

(65) Prior Publication Data
US 2018/0229945 A1 Aug. 16, 2018

(30) Foreign Application Priority Data
Aug. 4, 2015 (JP) ................................ 2015-154593

(51) Int. Cl.
*H01L 21/67* (2006.01)
*H01L 21/673* (2006.01)
(Continued)

(52) U.S. Cl.
CPC ........ *B65G 49/00* (2013.01); *H01L 21/67201* (2013.01); *H01L 21/67393* (2013.01); *H01L 21/67772* (2013.01)

(58) Field of Classification Search
CPC ......... H01L 21/67772; H01L 21/67775; H01L 21/67201
See application file for complete search history.

(56) References Cited

U.S. PATENT DOCUMENTS 6,470,927 B2 * 10/2002 Otaguro ............ H01L 21/67772
141/65
7,568,875 B2 * 8/2009 Le Guet ............ H01L 21/67772
414/411
(Continued)

FOREIGN PATENT DOCUMENTS

JP 2001-274220 A 10/2001
JP 2009-88437 A 4/2009
(Continued)

OTHER PUBLICATIONS

International Search Report dated Oct. 18, 2016, in PCT/JP2016/070568, filed Jul. 12, 2016.
(Continued)

*Primary Examiner* — Kaitlin S Joerger
(74) *Attorney, Agent, or Firm* — Oblon, McClelland, Maier & Neustadt, L.L.P.

(57) ABSTRACT

A load port including: a base as part of a wall partitioning a transportation space from an external space; an opening provided to the base; a door configured to open and close the opening and securing a lid to, and releasing a lid from, a container containing contents; and a first seal member for sealing the space between the base and the container. At least some of the container-side end surface of the door is located nearer to the transportation space than the container-side end part of the first seal member. The load port can keep a surrounding space clean when a FOUP is connected to a casing.

8 Claims, 29 Drawing Sheets

(51) Int. Cl.
*H01L 21/677* (2006.01)
*B65G 49/00* (2006.01)

(56) References Cited

U.S. PATENT DOCUMENTS

| | | | | |
|---|---|---|---|---|
| 9,666,464 | B2* | 5/2017 | Kikuchi | H01L 21/67775 |
| 10,134,619 | B2* | 11/2018 | Kondoh | H01L 21/67389 |
| 2006/0088272 | A1 | 4/2006 | Gilchrist et al. | |
| 2008/0236487 | A1* | 10/2008 | Hirano | H01L 21/67017 |
| | | | | 118/715 |
| 2009/0092468 | A1 | 4/2009 | Oyama et al. | |
| 2012/0076619 | A1* | 3/2012 | Takahashi | H01L 21/67772 |
| | | | | 414/217 |
| 2014/0064885 | A1 | 3/2014 | Oyama et al. | |
| 2015/0155192 | A1 | 6/2015 | Gilchrist et al. | |
| 2015/0221538 | A1* | 8/2015 | Ochiai | H01L 21/67775 |
| | | | | 414/217 |
| 2015/0311100 | A1* | 10/2015 | Miyajima | H01L 21/67017 |
| | | | | 414/217 |
| 2016/0086835 | A1* | 3/2016 | Kondoh | H01L 21/67772 |
| | | | | 414/217 |
| 2016/0260627 | A1* | 9/2016 | Nakano | H01L 21/67389 |
| 2016/0260628 | A1 | 9/2016 | Ochiai | |
| 2017/0170044 | A1* | 6/2017 | Okabe | H01L 21/02046 |
| 2018/0229945 | A1 | 8/2018 | Suzuki et al. | |
| 2018/0233392 | A1* | 8/2018 | Abe | H01L 21/67769 |
| 2018/0269095 | A1* | 9/2018 | Reuter | H01L 21/67393 |
| 2018/0366355 | A1* | 12/2018 | Koshti | H01L 21/67248 |

FOREIGN PATENT DOCUMENTS

| | | |
|---|---|---|
| JP | 2012-15550 A | 1/2012 |
| JP | 2014-53417 A | 3/2014 |
| JP | 2014-112631 A | 6/2014 |

OTHER PUBLICATIONS

International Preliminary Report on Patentability and Written Opinion dated Feb. 15, 2018 in PCT/JP2016/070568 filed Jul. 12, 2016 (with English translation).

U.S. Office Action dated Feb. 26, 2019 in co-pending U.S. Appl. No. 15/750,379, 9 pages.

* cited by examiner

FRONT ← SIDE / SIDE → REAR

LOAD PORT

TECHNICAL FIELD

The present invention relates to a load port having a door operation system capable of circulating gas in a wafer conveyance chamber, without exposing a transported wafer to outside air.

BACKGROUND ART

Traditionally, a wafer as a substrate is subjected to various processing steps to manufacture semiconductors. With further advancement in higher integration of elements and miniaturization of circuits in recent year, there is a demand for maintaining a high cleanliness level of environment surrounding wafers, so as to avoid adhesion of particles or moisture on the surface of a wafer. Further, in order to avoid a change in the characteristics of the surface, such as oxidation of a wafer surface, a wafer-surrounding environment is made an atmosphere of nitrogen which is an inert gas, or made vacuum state.

To properly maintain the atmosphere around the wafer, the wafers are placed inside a sealed storage pod called FOUP (Front-Opening Unified Pod), and nitrogen is filled in the inside thereof of the pod. Further, for transferring wafers between a processing apparatus which processes wafers and the FOUP, air EFEM (Equipment Front End Module) is used. The EFEM structures a wafer conveyance chamber which is substantially closed inside a casing. One of wall surfaces facing each other has a load port that functions as an interface unit with the FOUP, and the other wall surface is connected to a load lock chamber which is a part of the processing apparatus. Inside the wafer conveyance chamber, a wafer conveyance apparatus configured to convey wafers is provided. Wafers are loaded and unloaded between the FOUP connected to the load port and the load lock chamber.

As a load port, for example, PTL 1 suggests a structure in which the door unit protrudes from the casing towards the FOUP.

CITATION LIST

Patent Literature

[PTL 1] Japanese Unexamined Paten Publication No. 2014-112631

SUMMARY OF INVENTION

Technical Problem

In the load port described in PTL 1 however, the door unit protruding from the casing contacts the FOUP, when the FOUP is moved closer to the casing. This contact may cause scattering of fragments, thus contaminating the space surrounding the EFEM.

In view of the above, the present invention is made to address the above issues, and it is an object of the present invention to provide a load port that keeps the surrounding space clean, when an FOUP is connected to a casing.

Solution to Problem

The load port related to the present invention includes:
a base constituting a part of a wall separating a conveyance space front an external space;
an opening portion provided in the base,
a door configured to open and close the opening portion and to fix and release a lid member with respect to a container accommodating therein an article;
a first seal member for sealing between the base and the container;
wherein
a container-side end surface of the door is at least partially positioned closer to the conveyance space than a container-side end portion of the first seal member.

With this load port, even if the lid member of the container is inflated towards the base, the container-side end surface of the door is positioned closer to the conveyance space than the container-side end portion of the first seal member, when the container is attached to the opening portion. Therefore, the lid member and the door do not contact each other. This prevents the lid member from contacting the door and scattering fragments, and keeps the space surrounding the load port clean. Further, it is possible to restrain an impact of contact from stirring up the dusts on the door, or from shaking the container to stir up the dusts at the bottom portion of the container or deviate the position of accommodated article from the proper position.

The load port related to the present invention includes:
a clamp unit configured to press the container toward the base while the container is attached to the opening, wherein
a container-side end surface of the door is at least partially positioned closer to the conveyance space than a container-side end portion of the first seal member which is pressed towards the base by the container clamped by the clamp unit.

In the load port, the container-side end surface of the door is at least partially positioned closer to the conveyance space than the container-side end portion of the first seal member which is clamped and pressed against the base. Therefore, it is possible to reliably prevent contact of the lid member with the door, while the container is attached to the opening portion.

The load port related to the present invention includes:
an end surface of the door, which is to face the container, has a recess depressed towards the conveyance space.

With the load port, it is possible to reliably prevent the lid member from contacting the door, even if the lid member of the container is inflated towards the base.

In the load port related to the present invention:
the shape of the recess corresponds to an inflated surface of the lid member inflated by increasing the pressure inside the container.

In the load port, the shape of the recess corresponds to the inflated surface of the lid member which is inflated by increasing the pressure inside the container. Therefore, the lid member and the door are reliably kept from contacting each other, even if the container inflates in various shapes.

The load port related to the present invention includes:
a second seal member for sealing between the base and the door, wherein
a container-side end surface of the door is entirely positioned closer to the conveyance space than a container-side end portion of the first seal member.

In the load port, a container-side end surface of the door is entirely positioned closer to the conveyance space than a container-side end portion of the first seal member. Thus, while the lid member and the door are reliably kept from contacting each other sealing by the second seal member between the base and the door unit is maintained.

The load port related to the present invention includes:
a second seal member for sealing between the base and the door;

a sealed space defined by at least the first seal member, the second seal member, the lid member, and the door while the container is in contact with the opening portion via the first seal member;

a first gas injection unit configured to inject a gas into the sealed space; and a first gas discharge unit configured to discharge a gas from the sealed space.

The load port includes: the first gas injection unit configured to inject gas into the sealed space formed between the container and the door, while the container is in contact with the opening portion via the first seal member, i.e., while the container is attached to the opening portion, and the first gas discharge unit configured to discharge gas from the sealed space. With this, it is possible to remove the atmospheric air between the container and the door and fill in the nitrogen gas (purge), while the container is attached to the opening portion. Therefore, atmospheric air between the container and the door, which contain oxygen, moisture, particles and the like that may cause a change in the characteristics of the wafer such as oxidation of the wafer is prevented from entering the conveyance space or the container when the door is opened. In other words, oxygen, moisture, and particles in the sealed space can be eliminated before opening the sealed space by opening the lid member of the container. As a result, oxygen and the like do not leak into the container or the conveyance space when the lid member is opened, which makes it possible to maintain the cleanliness of the inside of the container and the conveying space.

The load port related to the present invention includes:

a second seal member for sealing between the base and the door;

a sealed space defined by the base, the first seal member, the second seal member, the lid member, and the door while the container is in contact with the base, and while the door abuts the base via the second seal member, wherein when the container is clamped to the base, the container is moved towards the door from a state in which the door and the lid member are separate from each other.

In this load port, when the container is clamped to the base, the container is moved towards the door from a state in which the door and the lid member are separate from each other. This way, the sealing performance between the container and the base through the first seal member is improved.

Advantageous Effects of Invention

With the present invention, even if the lid member of the container is inflated towards the base, the container-side end surface of the door is positioned closer to the conveyance space than the container-side end portion of the first seal member, when the container is attached to the opening portion. Therefore, the lid member and the door do not contact each other. This prevents the lid member from contacting the door and scattering fragments, and keeps the space surrounding the load port clean. Further, it is possible to restrain an impact of contact from stirring up the dusts on the door, or from shaking the container to stir up the dusts at the bottom portion of the container or deviate the position of accommodated article from the proper position.

In the present invention, the container-side end surface of the door is at least partially positioned closer to the conveyance space than the container-side end portion of the first seal member which is clamped and pressed against the base. Therefore, it is possible to reliably prevent contact of the lid member with the door, while the container is attached to the opening portion.

With the present invention, it is possible to reliably prevent the lid member from contacting the door, even if the lid member of the container is inflated towards the base.

In the present invention, the shape of the recess corresponds to the inflated surface of the lid member which is inflated by increasing the pressure inside the container. Therefore, the lid member and the door are reliably kept from contacting each other, even if the container inflates in various shapes.

In the present invention, a container-side end surface of the door is entirely positioned closer to the conveyance space than a container-side end portion of the first seal member. Thus, while the lid member and the door are reliably kept from contacting each other, sealing by the second seal member between the base and the door unit is maintained.

The present invention includes: the first gas injection unit configured to inject gas into the sealed space formed between the container and the door, while the container is in contact with the opening portion via the first seal member, i.e., while the container is attached to the opening portion, and the first gas discharge unit configured to discharge gas from the sealed space. With this, it is possible to remove the atmospheric air between the container and the door and fill in the nitrogen gas (purge), while the container is attached to the opening portion. Therefore, atmospheric air between the container and the door, which contains oxygen, moisture, particles and the like that may cause a change in the characteristics of the wafer such as oxidation of the wafer is prevented from entering the conveyance space or the container when the door is opened. In other words, oxygen, moisture, and particles in the sealed space can be eliminated before opening the sealed space by opening the lid member of the container. As a result, oxygen and the like do not leak into the container or the conveyance space when the lid member is opened, which makes it possible to maintain the cleanliness of the inside of the container and the conveying space.

In the present invention, when the container is clamped to the base, the container is moved towards the door from a state in which the door and the lid member are separate from each other. This way, the sealing performance between the container and the base through the first seal member is improved.

DESCRIPTION OF EMBODIMENTS

The following describes an embodiment of the present invention with reference to attached drawings.

Figure 1:
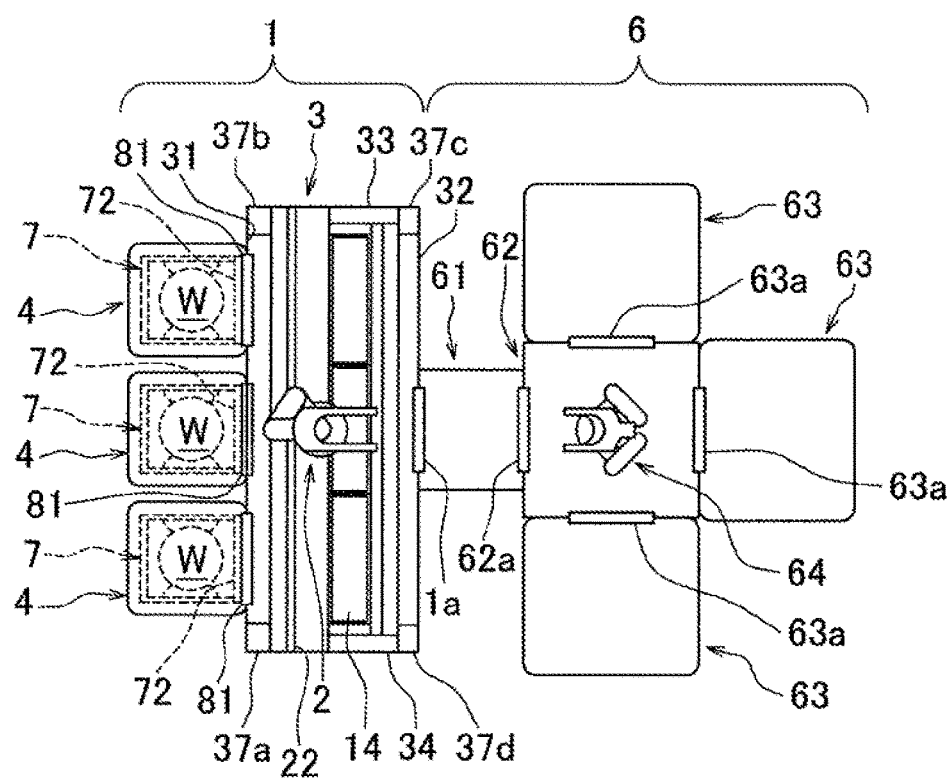
FIG. 1A plan view schematically showing a relation between an EFEM and a processing apparatus related to an embodiment of the present invention.
Figure 2:
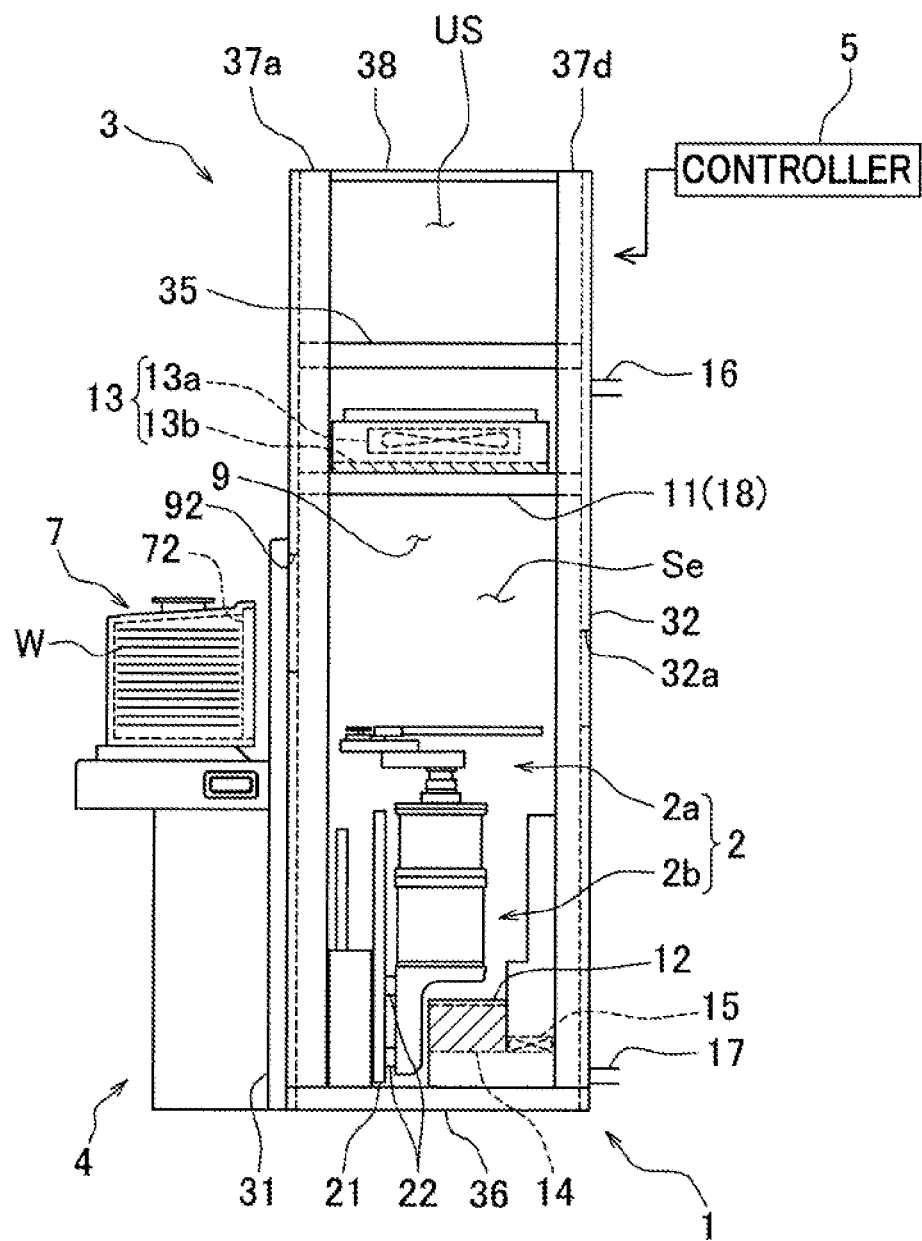
FIG. 2A side view showing a state in which a side wall of the EFEM is detached.

FIG. 1 is a plan view schematically showing a relation between an EFEM 1 and a processing apparatus 6 connecting thereto, related to an embodiment of the present invention. A top plate and the like of EFEM 1 and the processing apparatus 6 are removed so as to show their inside. Further, FIG. 2 is a side view showing the inside of the EFEM 1 by removing its side face wall. As shown in FIG. 1 and FIG. 2, the EFEM 1 includes: a wafer conveyance apparatus 2 configured to convey a wafer W between predetermined delivery positions; a box-shape casing 3 provided to surround the wafer conveyance apparatus 2; a plurality of (three in the figure) load ports 4 connected to the outside of a wall on the front surface side (front wall 31) of the housing 3; and a controller 5.

In the present application, when seers from the casing 3, a direction to the side to Which the load ports 4 are connected is defined as frontward, and a direction to the side of the rear wall 32, which is opposite to the front wall 31, is defined as rearward. Further, a direction perpendicular to the vertical direction and the front-rear direction are defined as side. In other words, the three load ports 4 are aligned on a side.

Further, as shown in FIG. 1, EFEM 1 is configured so that a load lock chamber 61 constituting a part of the processing apparatus 6 is connectable adjacent to the outside of the rear wall 32. By opening a door 1a provided between the EFEM 1 and the load lock chamber 61, the load lock chamber 61 is in communication with the inside of the EFEM 1. The processing apparatus 6 may be any of a wide variety of apparatuses. In general, the conveyance chamber 62 is provided adjacent to the load lock chamber 61, and a plurality of (three in the figure) processing units 63 each configured to perform processing to wafers W are provided adjacent to the conveyance chamber 62. Between the conveyance chamber 62 and the load lock chamber 61 or each of the processing units 63, a door 62a or a door 63a is provided which brings these components in communication with each other when opened. In addition, the wafer W is movable between the load lock chamber 61 and the processing units 63 by using a conveyance robot 64 provided in the conveyance chamber 62.

As shown in FIG. 2, the wafer conveyance apparatus 2 includes an arm unit 2a having a pick for conveying a wafer W placed thereon, and a base unit 2b supporting the arm unit 2a from below, and having a driving mechanism and an elevation mechanism for operating the arm unit. The base unit 2b is supported on the front wall 31 of the casing 3 through a support 21 and a guide rail 22. The wafer conveyance apparatus 2 is able to move along the guide rail 22 which extends in a width direction of the casing 3. By the controller 5 controlling an operation of the wafer conveyance apparatus 2, it is possible to convey a wafer (accommodated article) W in the FOUP (container) 7 of any of the load ports 4 aligned on a side to a load lock chamber 61, and convey the wafer W back to the FOUP 7 after it is subjected to processing in the processing unit 63.

Figure 3:
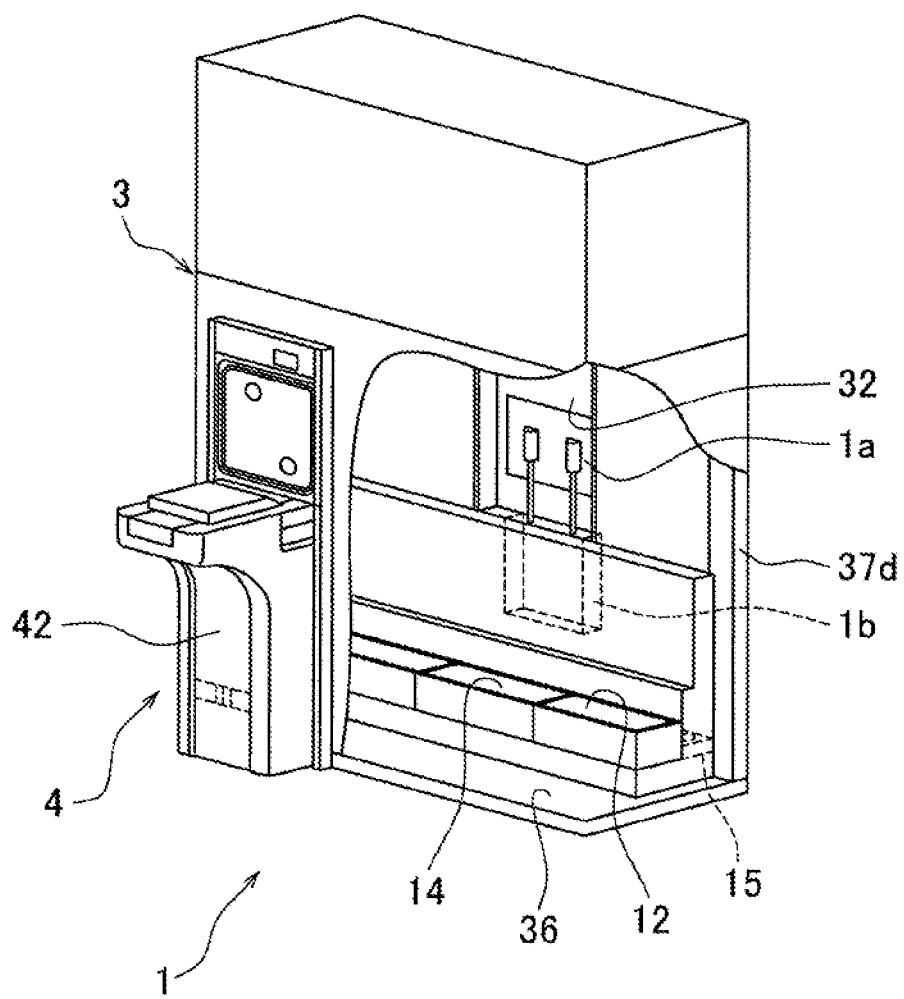
FIG. 3A perspective view showing a part of the EFEM broken away.

The casing 3 is structured by the front wall 31, the rear wall 32, and side walls 33 and 34 which surround the four sides of the wafer conveyance apparatus 2; a ceiling 35, a bottom 36, and pillars 37a to 37d supporting the walls 31 to 35 of the casing. To an opening portion 92 formed in the front wall 31, a load port 4 is attached. To a rectangular opening 32a provided in the rear wall 32, the load lock chamber 61 is connected. The casing 3 has a conveyance space 9 and a later-described gas return path 10, and a substantially closed space CS (see FIG. 4) including these is formed. It should be noted that the above-mentioned members are precisely assembled so as not to create a space from which internal gas do not leak out to the interface between the members; however, it is possible to provide a sealing member between the members to achieve an air-tight structure of the casing 3. Further, an opening 32a provided in the rear wall 32 has a driving mechanism 1b, and is closable by a door 1a (see FIG. 3) generally referred to as a gate valve, which is driven in vertical directions. Although illustration and description are omitted, the side walls 33, 34 are also provided with openings one of which is connected to an aligner used for position adjustment of a wafer W, and the other one of which is an opening for maintenance which is usually closed.

The load ports 4 each includes a door unit 81, and with the movement of the door unit 81 along with the lid member 72 provided to the FOUP 7, the FOUP 7 is opened with respect to the substantially closed space CS. The FOUP 7 is provided with many carrier units in the up-down directions so as to enable accommodation of many wafers W. Further, nitrogen is usually filled in the FOUP 7, and it is also possible to replace the atmosphere in the FOUP 7 with nitrogen, through load port 4, under control of the controller 5.

The controller 5 is structured as a controller unit provided in in upper space 1 above the ceiling 35, between the ceiling 35 and a top plate 38 of the casing 3. Further, the controller 5 performs drive control of the wafer conveyance apparatus 2, nitrogen substitution control of the FOUP 7 by the load port 4, opening/closing control of the door 1a and the door unit 81, nitrogen circulation control in the casing 3, and the like. The controller 5 is constituted by an ordinary microprocessor and the like having a CPU, a memory, an interface, and the like. The memory stores therein in advance programs necessary for processing, and the CPU successively retrieves and runs necessary programs, to achieve a desirable function in cooperation with peripheral hard resources. The nitrogen circulation control is described later.

Figure 4:
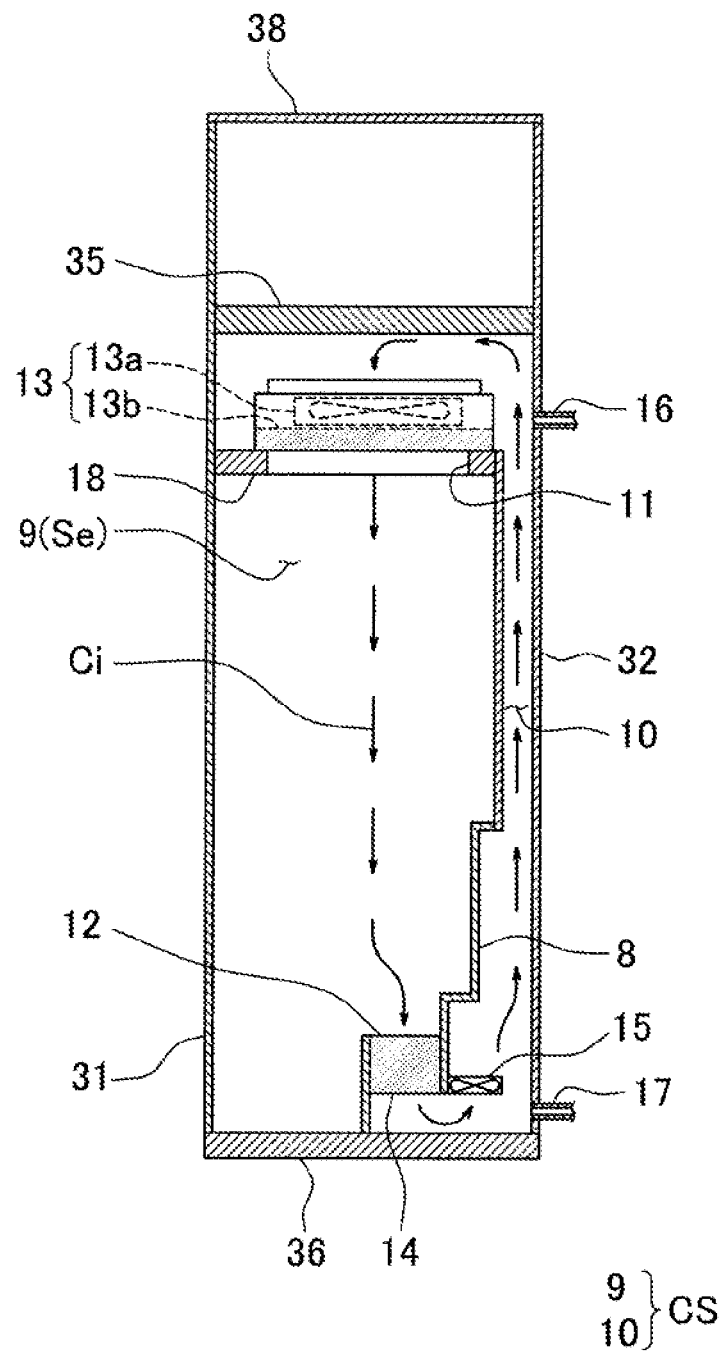
FIG. 4A schematic diagram showing a floss of the gas in a circulation path of EFEM.

As shown in FIG. 4, the substantially closed space CS is partitioned by a partition member 8, into the conveyance space 9 in which the wafer conveyance apparatus 2 is driven, and a gas return path 10. The conveyance space 9 and the gas return path 10 are in communication with each other only through a gas delivery port 11 provided in the width direction, in the upper portion of the conveyance space 9 and a gas suction port 12 provided in the width direction, in the lower portion of the conveyance space 9. The gas delivery port 11 and the gas suction port 12 generates a downward air current in the conveyance space 9, and generates a rising air current in the gas return path 10 to form a circulation path Ci indicated by arrows in FIG. 4 in the substantially closed space CS, thereby circulating gas. The present embodiment deals with a case where nitrogen which is an inert gas is circulated in the substantially closed space CS; however, the gas to be circulated is not limited to nitrogen, and may be other gases.

Next, the following details the structure of the gas return path 10. As shown in FIG. 4, the gas return path 10 is a space closed by the bottom 36, the rear wall 32, the ceiling 35, and the partition member 8. Further, the gas return path 10 is provided for returning gas sucked in from the gas suction port 12 in the lower portion of the conveyance space 9 to the gas delivery port 11 in the upper portion of the conveyance space 9.

To the rear side of the upper portion of the return path 10, a gas supplier (third gas injection unit) 16 for supplying nitrogen into the substantially closed space CS is connected. The gas supplier 16 is capable of controlling supply of the nitrogen and stop supplying of nitrogen based on a command from the controller 5. Therefore, when part of nitrogen leaks outside the substantially closed space CS, the gas supplier 16 supplies an amount of nitrogen having leaked out, to maintain constant nitrogen atmosphere in the substantially closed space CS. To the rear side of the lower portion of the return path 10, a gas discharger (third gas discharge unit) 17 for discharging gas in the substantially closed space CS is connected. The gas discharger 17 operates based on commands from the controller 5, and opens a not-shown shutter to communicate the inside of the substantially closed space CS with a gas delivery destination provided outside. With combination of the nitrogen supply by the above-mentioned gas supplier 16, substitution of nitrogen atmosphere in the substantially closed space CS is possible. It should be noted that the present embodiment deals with a case where the gas supplier 16 supplies nitrogen, because the gas circulated in the circulation path Ci is nitrogen however, in cases where a different gas is circulated, the gas supplier 16 circulates that gas circulated.

Further, the gas delivery port 11 is provided with a fan filter unit 13 (FFU 13) which is constituted by a fan 13a serving as a first wind-blower and a filter 13b. The fan filter unit 13 removes particles contained in the gas circulated in the substantially closed space CS, and blows wind downward in the conveyance space 9, thereby generating the downward air current within the conveyance space 9. It should be noted that the FFU 13 is supported by a support member 18 extended horizontally and connected to the partition member 8.

On the other hand, the gas suction port 12 is connected to a chemical filter 14, and the gas in the conveyance space 9 flows into the gas return path 10 through the chemical filter 14. As mentioned hereinabove, the wafer conveyance apparatus 2 (see FIG. 2) is supported on the front wall 31 of the casing 3 through the support 21 and the guide rail 22. Therefore, the gas suction port 12 is largely opened upward without interfering with the wafer conveyance apparatus 2. Further, as described above, since the gas suction port 12 extends in the width direction, it is possible to effectively suck particles even when particles are generated at a time of driving the wafer conveyance apparatus 2 along the guide rail 22 which is also extended in the width direction. With provision of the chemical filter 14 to the gas suction port 12, it is possible to remove molecules of contaminant generated in the processing apparatus 6 (see FIG. 1) and having flown into the conveyance space 9. Further, on the rear side of the chemical filter 14 in the gas return path 10, a fan 15 as a second wind-blower is provided across the width direction (see FIG. 4). The fan 15 blows air toward the downstream side of the gas return path 10, i.e., towards up in FIG. 4, thereby generating a gas suction force at the gas suction port 12, and delivers the gas having passed through the chemical filter 14 to move upward thereby generating a rising air current in the gas return path 10.

Thus, with the above-described fan 13a of FFU 13 and the fan 15, the gas in the substantially closed space CS is circulated by flowing downward in the conveyance space 9, and then flowing upward in the gas return path 10. Since the gas delivery port 11 is opened downward, gas is sent downward by the FFU 13. Since the gas suction port 12 is opened upward, the gas is sucked downward as it is without disturbing the downward air current generated by the FFU 13, thereby creating a smooth flow of the gas. The downward air current in the conveyance space 9 removes particles on wafers W are removed, and prevent the particles from floating in the conveyance space 9.

Next, the following describes, with reference to FIG. 4, an operation of nitrogen circulation control for circulating nitrogen in the EFEM 1 structured as described above.

First, as the initial stage, the controller 5 causes the gas supplier 16 to supply nitrogen to the substantially closed space CS while causing the gas discharger 17 to discharge gas. This way, the atmosphere of the substantially closed space CS of the EFEM 1 is purged, and substituted with a nitrogen atmosphere. After this state, if nitrogen in the circulation path Ci leaks outside, the controller 5 causes the gas supplier 16 to supply nitrogen according to the amount of nitrogen leaked out.

Then, by the controller 5 driving the fan 13a of the FFU 13 and the fan 15 in the substantially closed space CS with the nitrogen atmosphere, circulation of the gas through the circulation path Ci is created. At this time, in order to remove particles and molecules of contaminant in the gas circulating through the filter 13b of the FFU 13 and the chemical filter 14, a downward air current of clean nitrogen is constantly generated in the conveyance space 9.

In the EFEM 1 in the above state, wafers W are conveyed by communicating the FOUP 7 which is placed in the load port 4 and which has a nitrogen atmosphere with the conveyance space 9. At this time, both the conveyance space 9 and the FOUP 7 are in the same nitrogen atmosphere, and the nitrogen in the conveyance space 9 is also kept clean. Therefore, the pressure inside the FOUP 7 does not have to be made positive with respect to the pressure in the conveyance space 9 for the purpose of preventing particles and molecules of contaminant from entering the FOUP 7, and the consumption amount of nitrogen to be supplied to the FOUP 7 is restrained.

Figure 5:
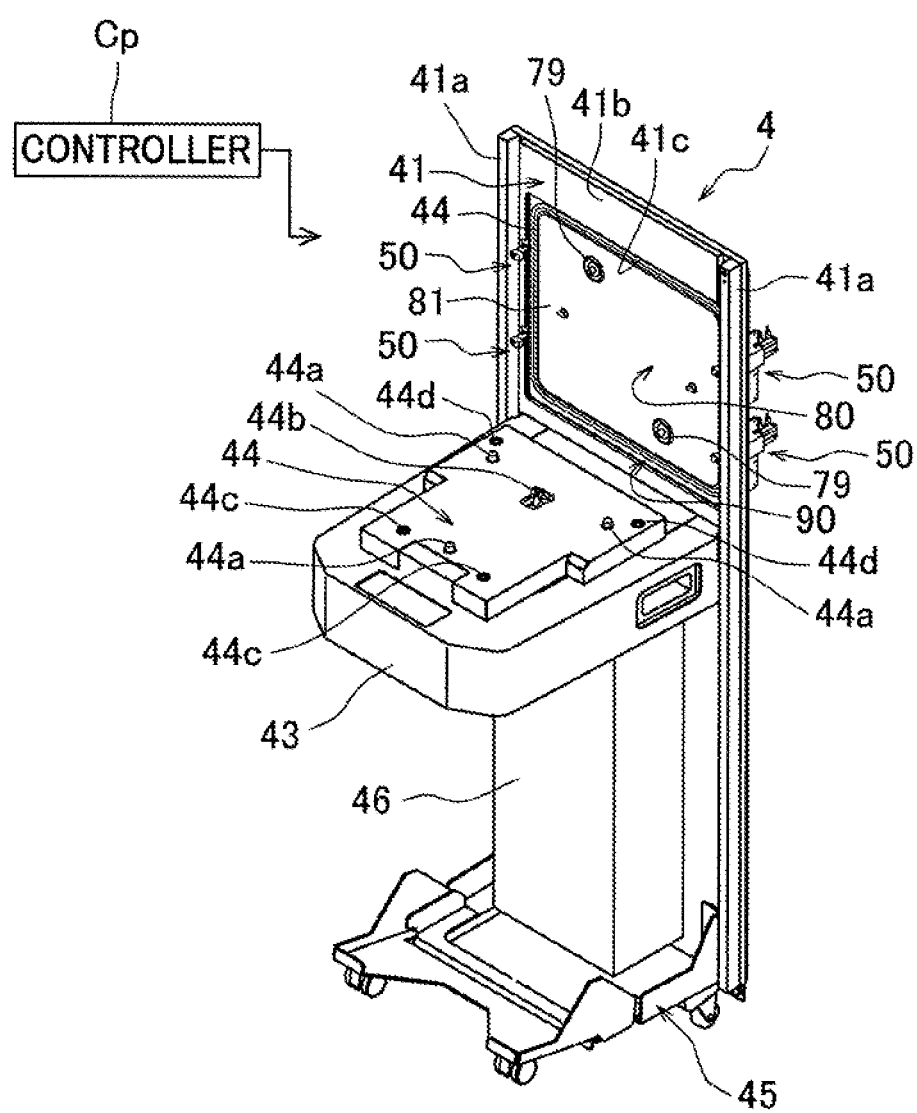
FIG. 5A perspective view of the load port of FIG. 1.
Figure 6:
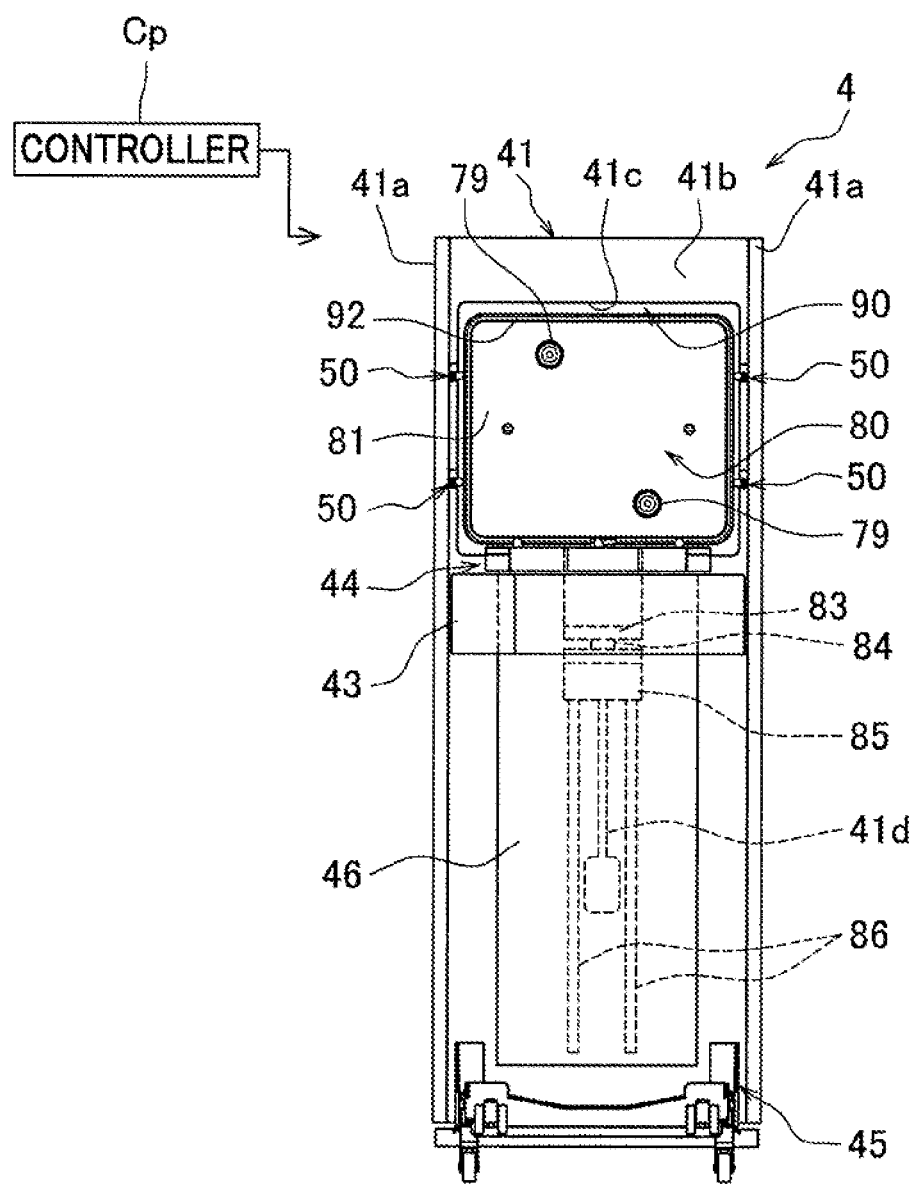
FIG. 6A front view of the load port of FIG. 1.
Figure 7:
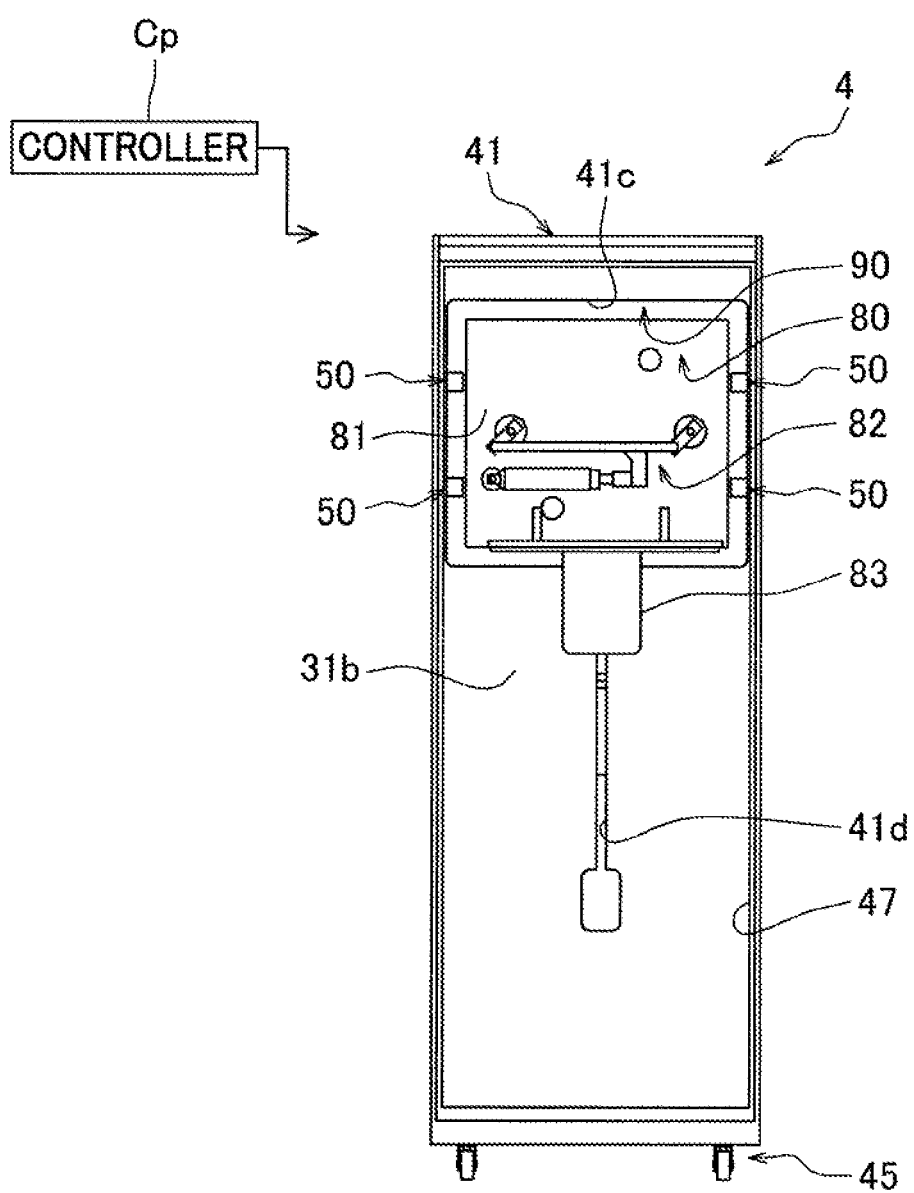
FIG. 7A rear view of the load port of FIG. 1.

FIG. 5, FIG. 6, and FIG. 7 are a perspective view, a front view, and a rear view of the load port 4, respectively. With reference to these figures, the structure of the load port 4 is described. It should be noted that, in these figures, an outside cover 42 (see FIG. 3) located in a lower part of the placement table 44 is removed to partially expose the internal structure.

In the load port 4, a base 41 extends upright from the rear of a bottom portion 45 to which casters and installation legs are attached, and a horizontal base portion 43 extends forward from a height position of approximately 60% of the base 41. Further, the placing table 44 for placing the FOUP 7 (see FIG. 2) is provided on the horizontal base portion 43.

Figure 8:
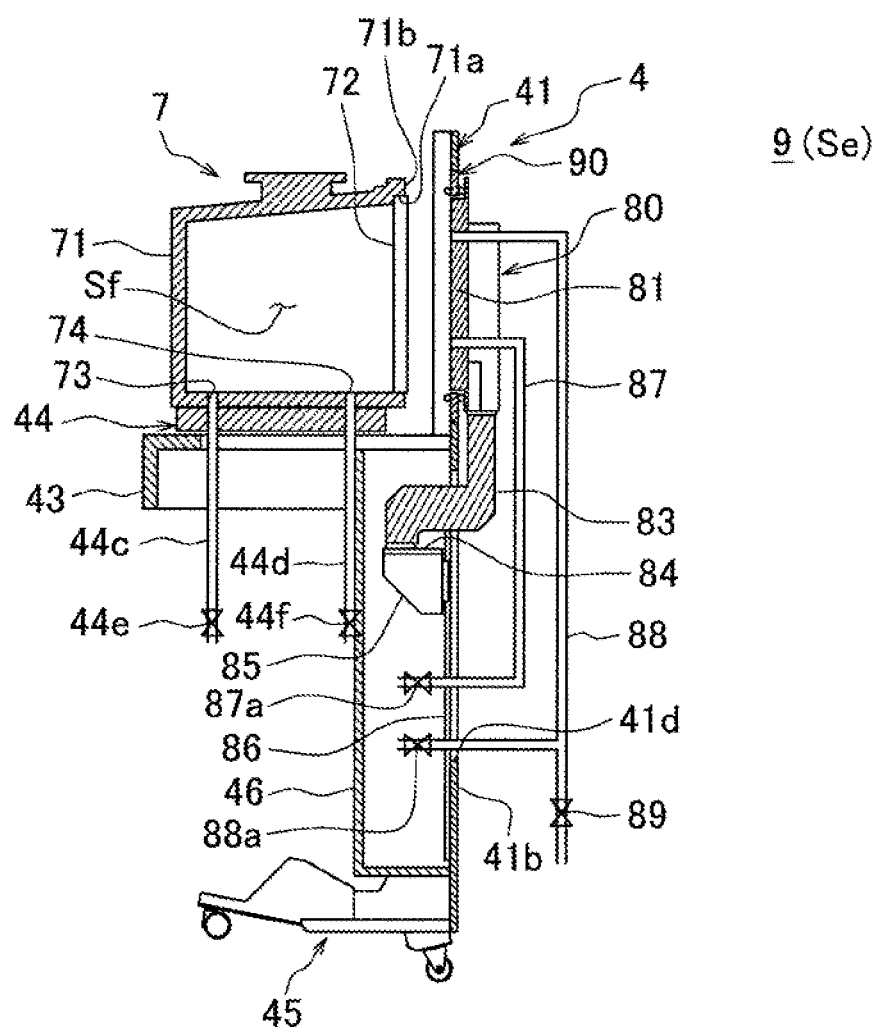
FIG. 8A side cross sectional view of the load port of FIG. 1.

As schematically shown in FIG. 8, the FOUP 7 includes: a main body 71 having an internal space Sf for accommodating therein wafers W (see FIG. 2) and a lid member 72 which opens and closes an opening 71a which is provided on one side of the main body 71 to serve as an entrance for wafers W When the FOUP 7 is correctly placed on the placement table 44, the lid member 72 faces the base 41. A space Sc is formed inside the lid member 72 so as to accommodate therein a later-described connecting unit 82 (see FIG. 7) for opening and closing the lid member 72 (see FIG. 11).

As shown in FIG. 5 and FOUP 7, the placement table 44 is provided with a positioning pin 44a for positioning the FOUP 7, and a lock protrusion 44b for fixing the FOUP 7 to the placement table 44. Through a locking operation, the lock protrusion 44b, in cooperation with the positioning pin 44a, is able to guide and fix the FOUP 7 to a proper position. Through an unlocking operation, the FOUP 7 is separable from the placement table 44. It should be noted that the placement table 44 is moveable in the front-rear directions by a placement table driving unit (not shown), while having the FOUP 7 placed thereon.

Further, the placement table 44 includes two second gas injection nozzles (second gas injection units) 44c each configured to supply gas into the FOUP 7 and two second gas discharge nozzles, (second gas discharge units) lid each configured to discharge gas from the inside of the FOUP 7. Each of the second gas injection nozzles 44c and each of the second gas discharge nozzles 44d are usually positioned lower than the top surface of the placement table 44, and advances upward to connect with a gas supply valve 73 and a gas discharge valve 74 (see FIG. 8) of the FOUP 7, respectively, at a time of use.

Figure 11:
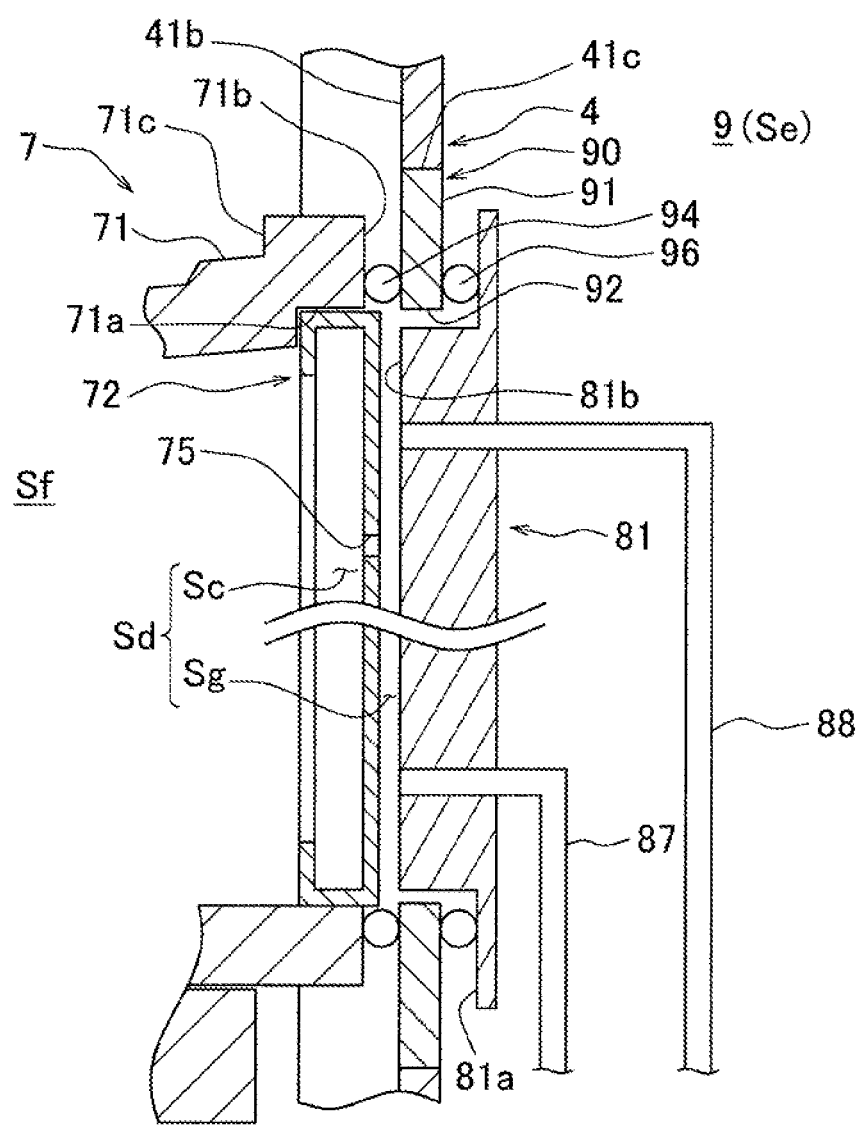
FIG. 11 A partially enlarged cross sectional view showing the sealed space portion sealed by the sealing member.
Figure 12:
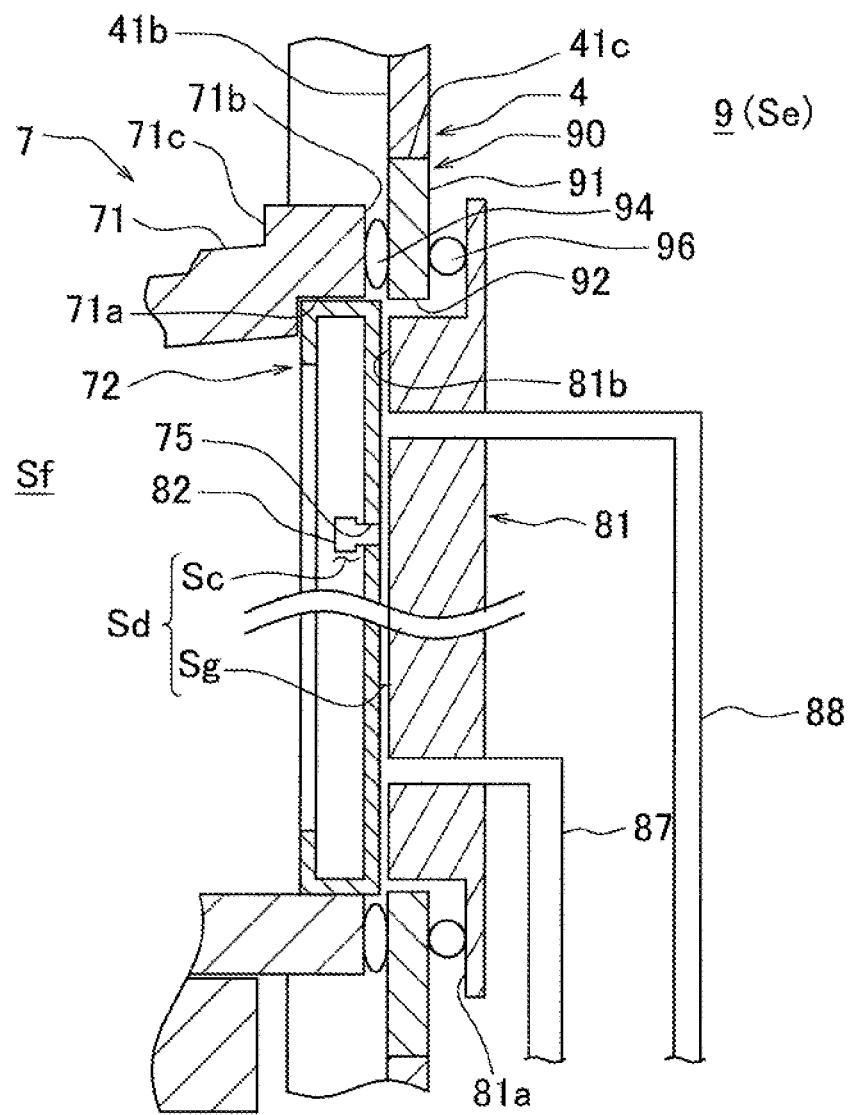
FIG. 12 A partially enlarged cross sectional view showing a state where the FOUP is brought close door unit by clamping.

At a time of use, one end of the second gas injection nozzle 44c communicates with the inside of the FOLD 7, and the other end thereof is provided with a second gas injection valve 44e. Similarly, one end of the second gas discharge nozzle 44d communicates with the inside of the FOUP 7, and the other end thereof is provided with a second gas discharge valve 44f. Through the gas supply valve 73, gas, such as dry nitrogen gas and the like is supplied to the internal space Sf of the FOUP 7 from the second gas injection nozzle 44c, and the gas in the internal space Sf is discharged from the second gas discharge nozzle 44d through the gas discharge, valve 74, thereby enabling gas-purge. By making a gas-supply amount larger than a gas-discharge amount, the pressure of the internal space Sf is set positive with respect to the pressure of the internal space Se of the casing 3 (see FIG. 2) or the outside. By raising the pressure in the FOUP 7 (internal space Sf), the surface of the lid member 72 is inflated towards the door unit 81 than an abutting surface 71b, as shown in FIG. 11.

The base 41 constituting the load port 4 constitutes a part of the front wall 31 which separates the conveyance space 9 from the external space. As shown in FIG. 5, the base 41 includes: pillars 41a provided upright on both sides, a base main body 41b supported by the pillars 41a, and a window unit 90 attached to a substantially rectangular window part 41c formed on the base main body 41b. The substantially rectangular shape herein means a basically rectangular shape with four sides, such that the four corners thereof are each formed in a smooth arc. In the vicinity of the outer circumference of the rear surface of the base min body 41b, a gasket 47 (see FIG. 7) serving as an elastic member formed in a rectangular shape is provided. The gasket 47 is formed of a rubber material with less gas permeation.

The window unit 90 is provided in a position to face the lid member 72 (see FIG. 8) of the FOUP 7 described above. The window unit 90 is provided with the rectangular opening portion 92 (see FIG. 15) a hereinbelow detailed, and hence is capable of opening the internal space Se of the casing 3 through this opening portion 92. The load port 4 has an opening/closing mechanism 80 which opens and closes the window unit 90 configured to be attachable to the FOUP 7.

As shown in FIG. 6, the opening/closing mechanism 80 includes: the door unit 81 configured to open and close the opening portion 92; a support frame 83 for supporting the door unit 81; a movable block 85 that supports the support frame 83 movably in the front-rear directions via a slide supporter 84; and a sliding rail 86 that supports the movable block 85 movably with respect to the base main body 41b in the vertical directions.

As shown in FIG. 8, the support frame 83 supports the lower rear portion of the door unit 81, and has a substantially clamp shape which extends downwards, and then protruding forward from the base main body 41b, passing through a slit-shaped insertion hole 41d provided to the base main body 41b. The slide supporter 84 that supports the support frame 83, the movable block 85, and the sliding rail 86 are provided in front of the base main body 41b. Thus, driving parts for moving the door unit 81 are on the outer side of the casing 3, and even if particles are generated in these parts, the particles are restrained from entering the casing 3 because the insertion hole 41d is formed in a small slit-shape.

The following details the door unit 81 of the opening/closing mechanism 80. As shown in FIG. 8, the door unit 81 is provided with a first gas injection nozzle (first gas injection unit) 87 configured to inject gas between the FOUP 7 and the door unit 81, and a first gas discharge nozzle (first gas discharge unit) 88 configured to discharge gas between the FOUP 7 and the door unit 81, when the FOUP 7 is attached to the window unit 90. One end of the first gas injection nozzle 87 extends to the outer surface of the door unit 81, and the other end portion is provided with a first gas injection valve 87a. Similarly, one end of the first gas discharge nozzle 88 extends to the outer surface of the door unit 81, and the other end portion is provided with a first gas discharge valve 88a. While the door unit 81 and the lid member 72 are integrated through a clamp-operation as hereinafter described, the first gas injection nozzle 87 which is in communication with the sealed space Sd (see FIG. 11) supplies thereto a gas such as dry nitrogen gas and the like, and the first gas discharge nozzle 88 which is in communication with the sealed space Sd discharges therefrom the gas, thereby enabling gas-purge. It should be noted that the first gas discharge nozzle 88 is branched off to the equalizing valve 89, and is used as a nozzle for pressure equalization which equalizes the pressures of the sealed space Sd and the conveyance space 9.

Figure 9:
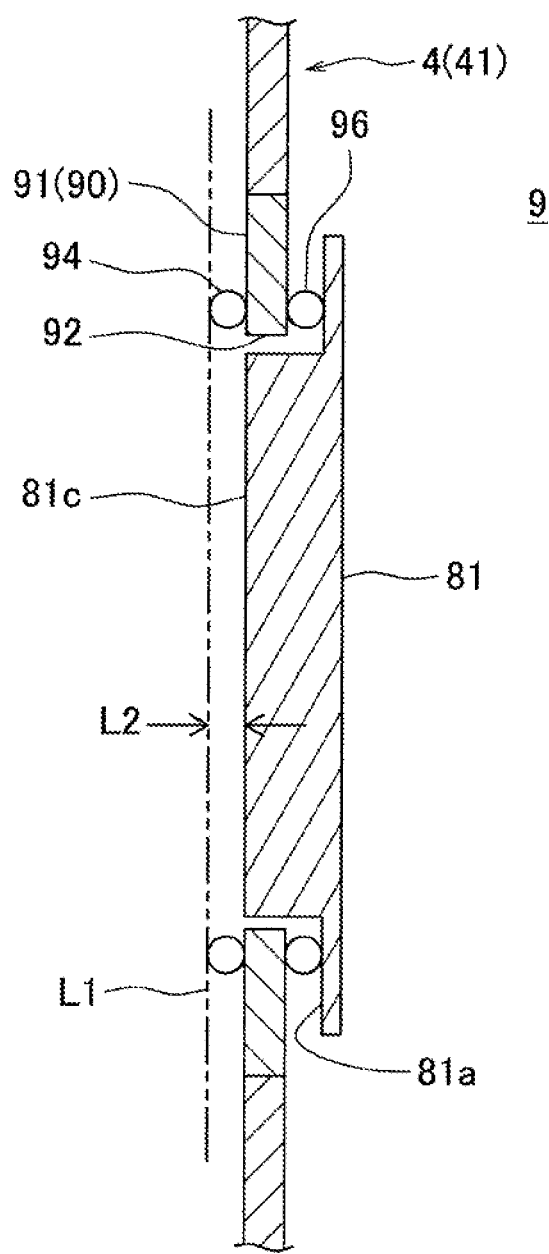
FIG. 9A partially enlarged cross sectional view showing a relationship between a door runt and a first seal member.

FIG. 9 is a partially enlarged cross sectional view of FIG. 8 showing a relationship between the door unit 81 and an O-ring (first seal member) 94. As shown in FIG. 9, an FOUP 7-side end surface 81c of the door unit 81 is shifted towards the conveyance space 9 by a desirable dimension of L2 from an FOUP 7-side end portion of the O-ring 94. Therefore, the FOUP 7-side end surface 81c of the door unit 81 is entirely positioned closer to the conveyance space 9 than the FOUP 7-side end portion of the O-ring 94. Thus, while the lid member 72 and the door unit 81 are reliably kept from contacting each other, sealing by the O-ring 96 between the base 41 and the door unit 81 is maintained. It should be noted that the figure indicates with an imaginary line L1 the position of the FOUP 7-side end portion of the O-ring 94. The dimension L2 is, for example, 0.1 mm or more but not more than 3 mm.

Further, actuators (not shown) are provided for moving the door unit 81 in the front-rear directions and the up-down directions, and the door unit 81 is movable in the front-rear directions and in the up-down directions, with drive instructions to these actuators, from the controlling unit Cp.

Further, in front of the base main body 41b, there is a cover 46 (see FIG. 8) which extends downward from immediately below the horizontal base portion 43, and the support frame 83, the slide supporter 84, the movable block 85, and the sliding rail 86 are covered and sealed by the cover 46. Therefore, although the insertion hole 41d is formed in the base main body 41b, the gas in the housing 3 (see FIG. 3) does not flow outside through this insertion portion. Inside the cover 46 are the lower end of the first gas injection nozzle 87, the first gas injection valve 87a, the first gas discharge nozzle 88, and the first gas discharge valve 88a.

The door unit 81 includes: an adsorption unit 79 (see FIG. 6) configured to adsorb the lid member 72 of the FOUP 7 and a connecting unit 82 (see FIG. 7) for performing a latch operation to open and close the lid member 72 of the FOUP 7, and for holding the lid member 72. The door unit 81 fixes or release the fix of the lid member 72 so as to enable removal and attachment of the lid member 72 from/to the FOUP 7. The connecting unit 82 makes the lid member 72 an openable state through an unlatching operation of the lid member 72, and integrate by coupling the lid member 72 to the door unit 81. To the contrary, the connecting unit 82 is capable of releasing the lid member 72 from the door unit 81, and attach the lid member 72 to the main body 71.

Figure 15:
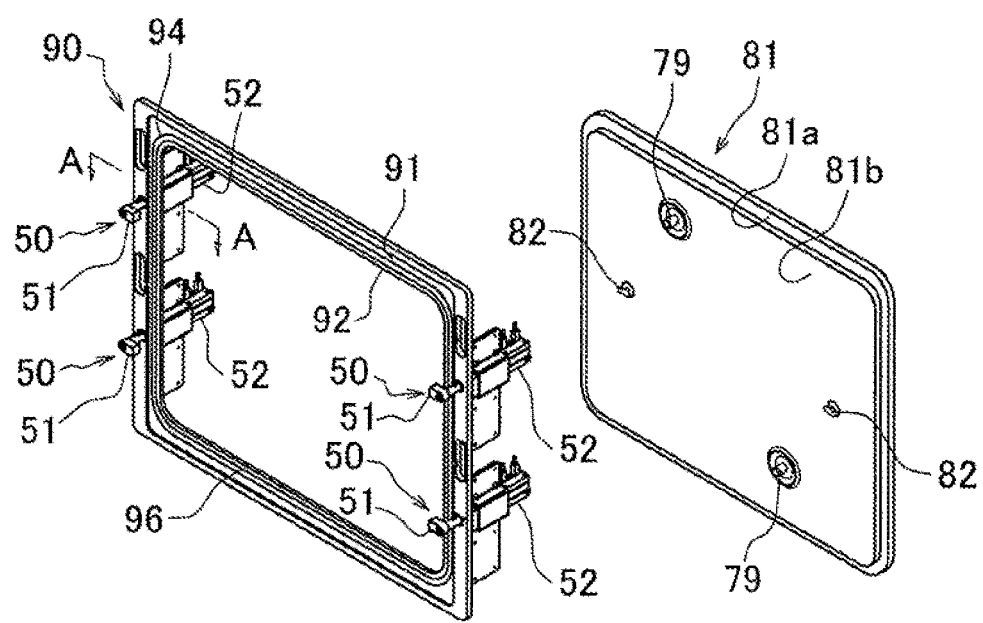
FIG. 15 An enlarged perspective view providing an enlarged view of the main parts of a window unit and the door unit constituting the EFEM.

Here, with reference to FIG. 15, the following describes details of the stricture of the above-mentioned window unit 90. The window unit 90 includes a window flame 91, O-rings 94 and 96 serving as elastic members to be attached thereto, and clamp units 50 each serving as an attracting unit which brings the FOUP 7 into close contact with the window frame 91 via the O-ring 94.

The window frame 91 has a frame-shape with a substantially rectangular opening portion 92. The window frame 91 constitutes a put of the base 41 (see FIG. 5) described above as a constituting element of the window unit 90, the opening portion 92 opens the front wall 31 serving as a wall surface of the casing 3. On the front surface of the window frame portion 91, the O-ring 94 is disposed so as to circle around the vicinity of the rim of the opening portion 92. On the rear surface of the window frame portion 91, the O-ring 96 is disposed so as to circle around the vicinity of the rim of the opening portion 92.

Figure 16:
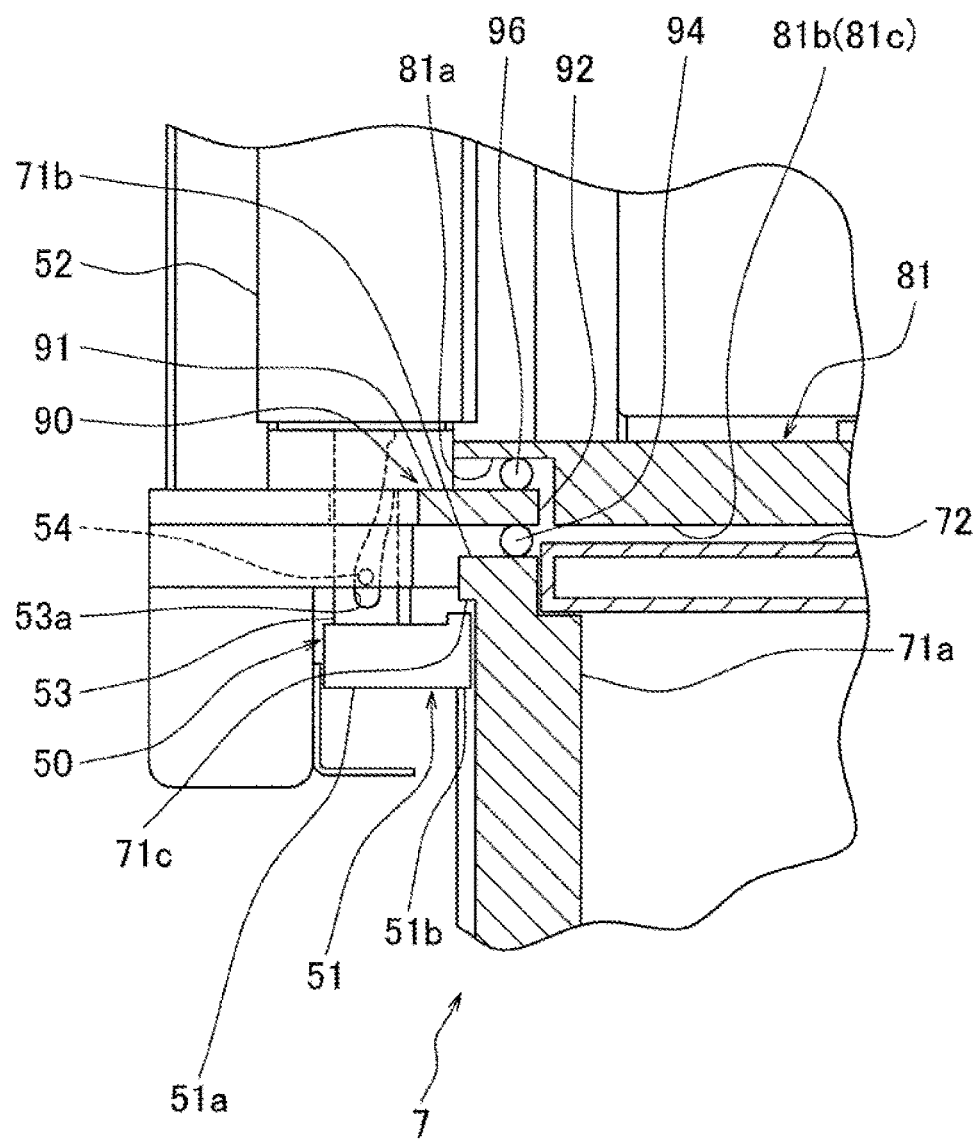
FIG. 16 An enlarged cross sectional view providing an enlarged view of the main part of a cross section taken along A-A shown in FIG. 15.

The opening portion 92 is slightly larger than the outer circumference of the lid member 72 (see FIG. 8) of the FOUP 7, and the lid member 72 is moveable through this opening portion 92. Further, during a state where the FOUP 7 is placed on the placement table 44, the front surface of the main body 71, as an abutting surface 71b, which surrounds the lid member 72 abuts the front surface of the window frame 91 via the O-ring 94. This way, the O-ring 94 seals off the rim of the opening portion 92 (base 41) and the FOUP 7 (see FIG. 16), while the FOUP 7 is attached to the window unit 90.

Further, on the rear surface of the window frame 91, the door unit 81 described above is abutted through the O-ring (second seal member) 96. This way, the O-ring 96 seals off the rim of the opening portion 92 and the door unit 81. Specifically, a thin portion 81a provided in a flange-like manner abuts against the outer circumference of the door unit 81. Since a thick portion 81b on the inner side of the thin portion 81a is formed smaller than the opening portion 92, it protrudes forward through the opening portion 92.

As shown in FIG. 15, the clamp units 50 are arranged in four positions in total, on both sides of the window frame 91, apart from each other in the up-down directions. Each clamp unit 50 is generally constituted by an engagement piece 51 and a cylinder 52 which operates the engagement piece 51, and presses the FOUP 7 against the base 41, while the FOUP 7 is attached to the window unit 90.

Figure 17:
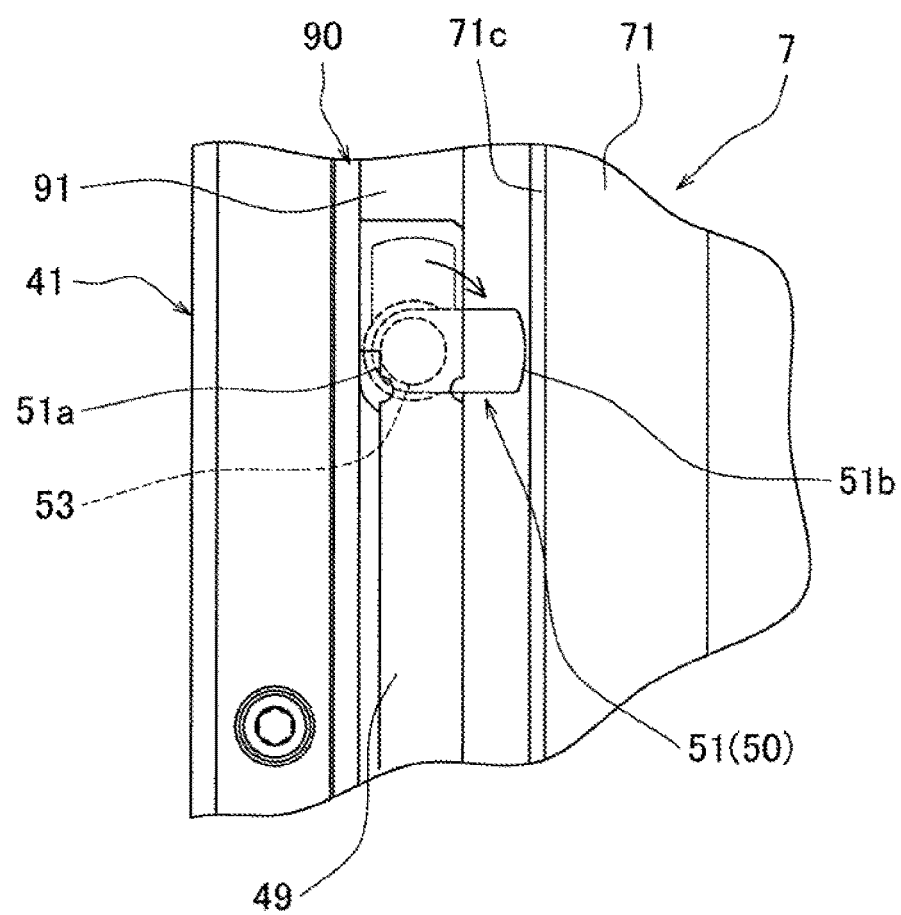
FIG. 17 An enlarged front view of a main part showing a clamp provided in a window unit.

The cylinder 52 constituting the clamp unit 50 is attached on the rear side of the window frame 91, and has a shaft 53 which is capable to moving forward and retracting through a hole provided in the window frame 91. To the leading end of the shaft 53 is attached the base end 51a of the engagement piece 51, and the leading end 5ib extends from this base end 51a towards the outer circumferential direction of the shaft 53. On the outer circumference of the shaft 53, a guide move 53a whose phase is twisted by 90° in the axial direction is formed. Inside the guide groove 53a, a guide pin 54 fixed to the side of the window frame 91 is inserted from a radial direction. Therefore, with movement of the cylinder 52 forward or backward, the guide groove 53a is guided by the guide pin 54, and the shaft 53 pivots 90° around the axial center. Then, as shown in FIG. 17, when the engagement piece 51 sticks out forward along with the shaft 53, the leading end 51b faces upward, and when the engaging piece 51 is drawn rearward, the leading end 51b is directed towards the inside of the FOUP 7. With the leading end 51b of the engagement piece 51 directed inside through the clamp operation, it engages with the flange portion 71c sticking out from the FOUP 7 towards a side. While maintaining this engaged state, the shaft 53 is further retracted by the cylinder 52. This way, the abutting surface 71b of the FOUP 7 is brought into a clamped state of further tightly attached to the O-ring 94. Such a clamp unit 50, when operated in four positions, evenly deforms the O-ring 94 and improves the sealing performance. During the clamped state too, the FOUP 7-side end surface 81c of the door unit 81 is positioned closer to the conveyance space 9 than the FOUP 7-side end portion of the O-ring 94, which is pressed towards the side of the base 41 by the abutting surface 71b of the FOUP 7.

Further, when the engagement piece 51 is moved forward, the leading end 51b is directed upward so as not to interfere with the flange portion 71c, when viewed from the front. This way, the FOUP 7 is movable with the placement table 44. It should be noted that, to move the leading end 51b forward, the leading end 51b may be directed not only the upward direction, but also a downward or an outward direction, as long as the leading end 51b does not interfere with the flange portion 71c.

Figure 18:
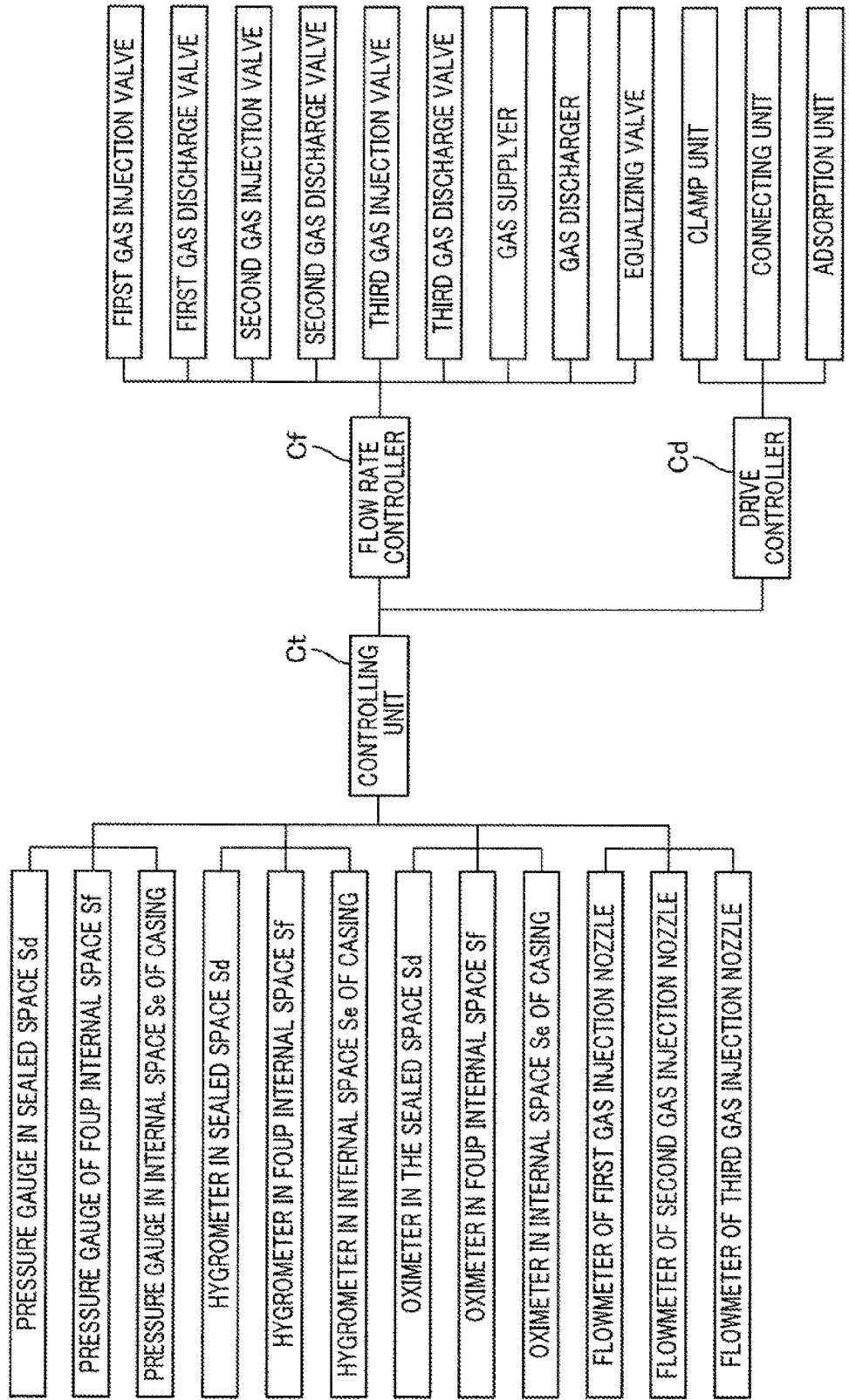
FIG. 18 A block diagram showing a connection state amongst a controlling unit, pressure gauges, valves.

The load port 4 structured as described above is given drive instructions for various parts thereof to operate, from the controlling unit Cp shown in FIG. 5. Further, as shown in FIG. 18, an input end of the controlling unit Ct is connected to a pressure gauge for measuring the pressure of the sealed space Sd, a pressure gauge for measuring the pressure of the internal space Sf of the FOUP 7, and a pressure gauge for measuring the pressure of the internal space Se of the casing 3. Similarly, an input end of the controlling unit Ct is connected to a hygrometer for measuring the humidity of the sealed space Sd, a hygrometer for measuring the humidity of the internal space Sf of the FOUP 7, and a hygrometer for measuring the humidity of the internal space Se of the casing 3. An input end of the controlling unit Ct for measuring the oxygen concentration is connected to an oxygen (concentration) gauge for measuring the oxygen concentration of the sealed space Sd, an oxygen (concentration) gauge for measuring the oxygen concentration of the internal space Sf of the FOUP 7, and an oxygen (concentration) gauge for measuring the oxygen concentration of the internal space Se of the casing 3. An input end of the controlling unit Ct related to the flow rate is connected to a flowmeter for measuring the flow rate of the first gas injection nozzle 87, a flowmeter for measuring the flow rate of the second gas injection nozzle 44c, and a flowmeter for measuring the flow rate of the third gas injection unit 16.

An output end of the controlling unit Ct is connected to the first gas injection valve 87a, the first gas discharge valve 88a, the second gas injection valve 44e, the second gas discharge valve a third gas injection valve, a third gas discharge valve, the gas supplier 16, the gas discharger 17 and the equalizing valve 89, via a flow rate controller Cf, and is connected to the clamp units 50, the connecting unit 82, and the adsorption unit 79, via a drive controller Cd. The controlling unit Ct is installed in the EFEM 1 and includes various memories and controllers for accepting operation by a user. Amongst these controllers of the EFEM 1 are the flow rate controller Cf and the drive controller Cd.

The following describes, with reference to FIG. 8 to FIG. 12, an example operation involving the load ports 4 of the present embodiment. In the initial state, each valve is closed.

FIG. 8 shows a state in which the FOUP 7 is placed on the placement table 44, and spaced from the base 41. During this state, the door unit 81 abuts the rear surface of the window frame 91 (see FIG. 15) constituting the window unit 90, via the O-ring 96. Therefore, there will be no space between the window frame 91 and the door unit 81, and a high sealing performance is achieved. This restrains leakage of gas to the outside when the internal space Se of the casing 3 is filled with nitrogen gas and the like, and restrains an outside gas from entering into the internal space Se.

Figure 19:
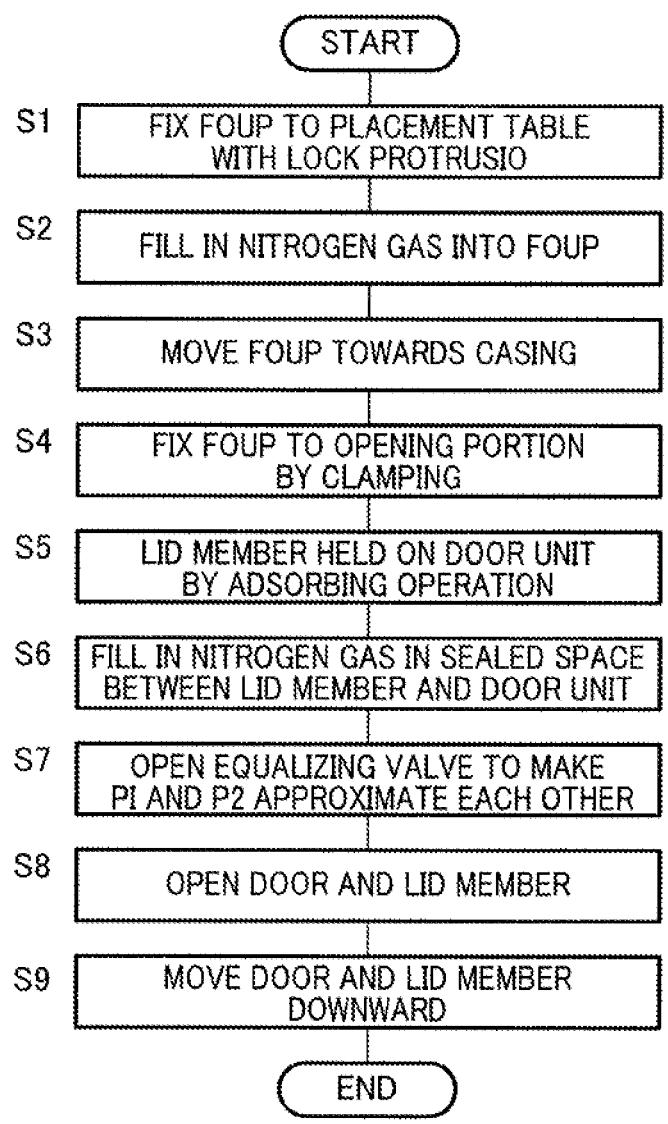
FIG. 19 A flowchart showing a procedure of connecting and communicating the FOUP with EFEM.

As shown in FIG. 19, in step S1, the FOUP 7 is suitably positioned and fixed to the placement table 44 by locking operation by the lock protrusion 44b (see FIG. 5) and positioning action done by the positioning pins 44a.

Then, the second gas injection nozzle 44c and the second gas discharge nozzle 44d of the placement table 11 protrude upward and connect to the gas supply valve 73 and the gas discharge valve 74 of the FOUP 7. In the following step S2, the second gas injection valve 44e is opened to supply fresh and dry nitrogen gas through the second gas injection nozzle 44c and the gas supply valve 73. By opening the second gas discharge nozzle 44f at the same time, the gas having been accumulated in the internal space Sf is discharged through the gas discharge valve 74 and the second gas discharge nozzle 44d. Through this gas-purge operation, the internal space Sf is filled with the nitrogen gas while the pressure is made higher than the pressure of the internal space Se of the casing 3. It should be noted that, the filling in of the nitrogen gas to the FOUP 7 is continued until the present flow ends.

Figure 10:
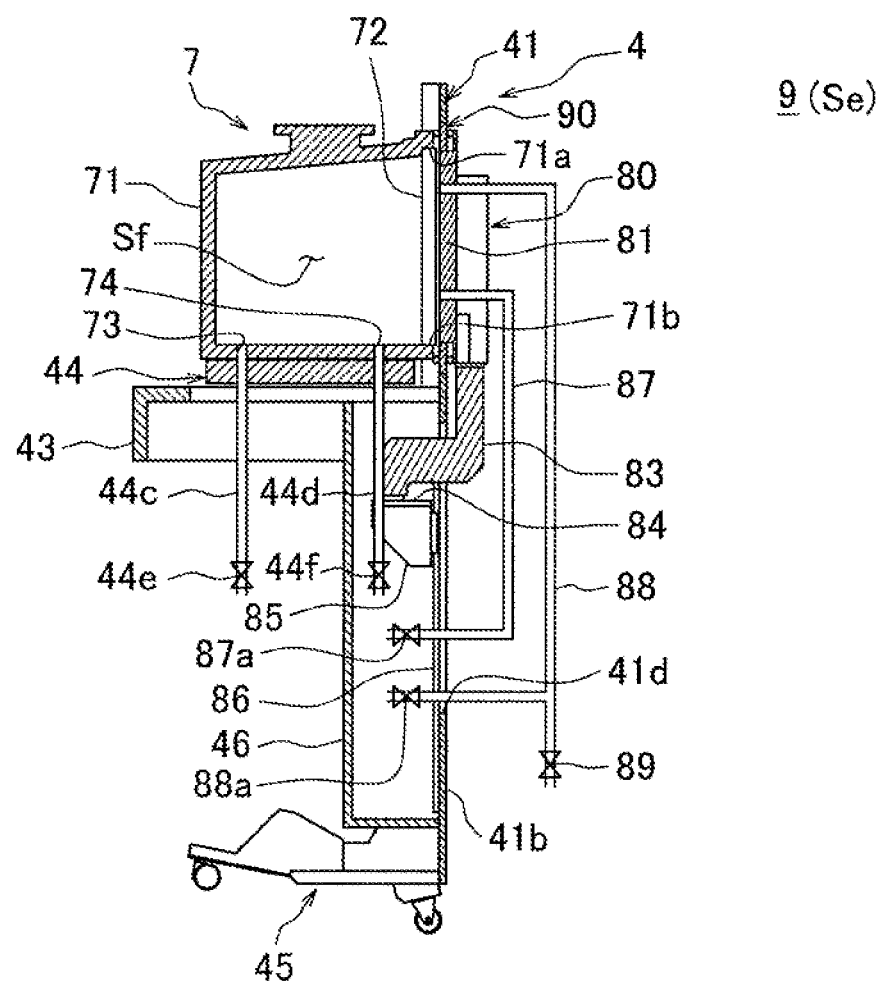
FIG. 10 A side cross sectional view showing a state where the FOUP is moved from the state shown Ere FIG. 8, towards the casing.

Next, in step S3, the placement table 44 is moved rearward to have the abutting surface 71b of the FOUP 7 abut the window frame 91, as shown in FIG. 10. At this time, the end surface 81c of the door unit 81 is positioned closer to the conveyance space 9 than the FOUP 7-side end portion of the O-ring 94, by a predetermined dimension of L2. Therefore, even if the lid member 72 of the FOUP 7 is inflated towards the door unit 81, the lid member 72 does not contact the end surface 81c of the door unit 81, because the abutting surface 71b of the FOUP 7 abuts the O-ring 94 when the FOUP 7 is brought closer to the window unit 90 (see FIG. 11). Therefore, sealing between the O-ring 96 and the door unit 81 is reliably maintained. As described, the abutting surface 71b abuts the window frame 91 via the O-ring 94, and the door unit 81 abuts the window frame 91 via the O-ring 96, thereby forming the sealed space Sd. The base 41, the O-rings 94 and 96, the lid member 72, and the door unit 81 which form the sealed space Sd, along with the opening portion 92, the first gas injection nozzle 87 and the first gas discharge nozzle 88 constitute the door operation system.

To move the placement table 44, the engagement pieces 51 (see FIG. 15) are protruded forward in advance by the cylinders 52 constituting the clamp units 50, so that their the leading ends 51b are directed upward and do not interfere with the FOUP 7.

Then, in step S4, the FOUP 7 is clamped and fixed to the window unit 90. Thus, from the state in which the door unit 81 and the lid member 72 are apart from each other, bringing the FOUP 7 closer to the door unit 81 causes elastic deformation of the O-ring 94, thus improving the sealing performance between the FOUP 7 and the base 41 (see FIG. 12). It is preferable to set the distance between the door unit 81 and the lid member 72, when the FOUP 7 is brought closer to the door unit 81 by the clamp units 50, to a distance that enables the above-described latching operation and unlatching operation.

Specifically, the engagement pieces 51 are retracted rearward by the cylinders 52 constituting the clamp units 50, so as to engage with the flange portion 71c of the FOUP 7 with the leading ends 51b directed inward. Further retracting the leading ends 51b causes the abutting surface 71b of the FOUP 7 further firmly contact the O-ring 94, thus improving the sealing performance. The series of the above operations is referred to as the clamp operation. At this time, as shown in FIG. 11, a space Sg is formed between the lid member 72 and the door unit 81, which is in communication with the internal space Sc of the lid member through a fitting hole 75 to which the connecting unit 82 is fitted. The space Sg and the space Sc constitutes the sealed space Sd between the FOUP 7 and the door unit 81.

In step S5, the connecting unit 82 (see FIG. 7) provided to the door unit 81 is operated to make the lid member 72 in the unlatched state and detachable from the main body 71, while the door unit 81 integrally holds the lid member 72 through the adsorption unit 79.

In step S6, the first gas injection valve 87a is opened to supply nitrogen gas to the sealed space Sd from the first gas injection nozzle 87. At the same time, the first gas discharge valve 88a is opened to discharge the gas (atmospheric air) having been accumulated in the sealed space Sd from the first gas discharge nozzle 88. After elapse of a predetermined time, the first gas injection valve 87a and the first gas discharge valve 88a are closed to end filling of the gas to the sealed space Sd. It should be noted that the gas injection operation of injecting gas into the sealed space Sd by the first gas injection nozzle 87 and the discharge operation of discharging gas from the sealed space Sd by the first gas discharge nozzle 88 may be repeated. The atmospheric air herein encompasses oxygen, moisture, particles, and the like which may cause a change in the properties of the wafers W, such as oxidation of the Wafers W. Further, discharging of the gas (atmospheric air) having accumulated in the sealed space Sd means not only discharging of the atmospheric air present between the FOUP 7 and the door unit 81, but also means discharging the gas inside the lid member 72, to enable filling of the gas is possible.

In step S7, the pressures of the internal space Sf of the FOUP 7 and the sealed space Sd are equalized. Specifically where the pressure inside the internal space Sf after the clamp operation is P1 and the pressure of the sealed space Sd is P2, the P1 and P2 are controlled to approximate each other.

This pressure adjustment is done by adjusting the flow rates of the first gas injection nozzle 87 and the first gas discharge nozzle 88, based on the pressures detected by the pressure gauges of the sealed space Sd and the FOUP 7. However, pressure adjustment may be performed without using a pressure gauge. Specifically, a pressure is estimated based on the flow rates of the first gas injection nozzle 87 and the first gas discharge nozzle 88, and the flow rates of the second gas injection nozzle 44c and the second gas discharge nozzle 44d, and the pressure adjustment may be performed based on this estimated pressure. This contributes to cost reduction because pressure adjustment is possible without a pressure gauge. When estimate the pressure, the estimation may take into account a reached-oxygen concentration by the oxygen concentration gauge or the reached-humidity measured by the hygrometer.

Adjustment of pressure is possible by various methods. If the FOUP to be used is known in advance, the volumes of the internal space Sf of the FOUP 7 to be used and the lid member of the FOUP 7 are determined. Therefore, the volume of the sealed space Sd is roughly predictable. Therefore, by filling the gas into the sealed space Sd for a predetermined period, at a predetermined flow rate, the pressure P2 of the sealed space Sd is adjustable to a predetermined pressure. In this case, a pressure gauge, an oxygen concentration gauge, and a hygrometer are not necessary for adjustment of the pressure.

In the above, a method of adjusting the pressure P2 is described. This method however is also applicable to adjustment of the pressures P1 and P3. Further, the pressure adjustment may be done by adjusting the flow rates, adjustment by the equalizing valve, and a combination of flow rate adjustment and adjustment by equalizing valve. These mechanisms for use in the pressure adjustment is collectively referred to as pressure adjuster.

Figure 13:
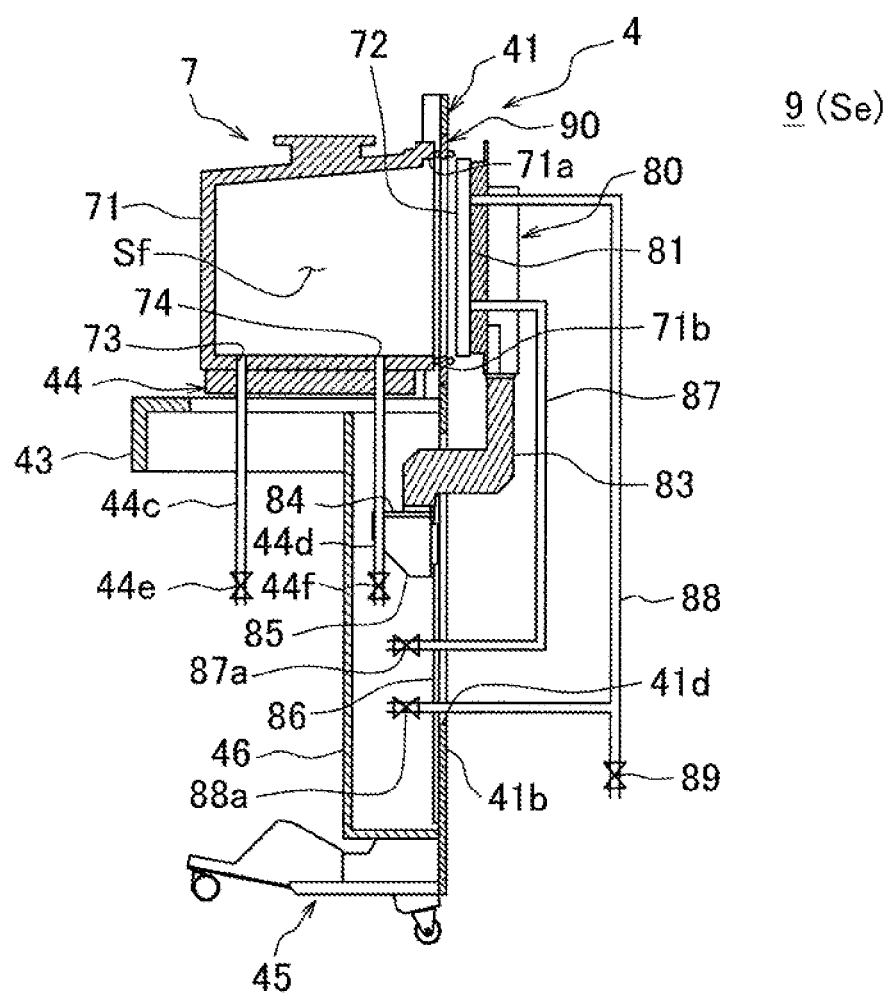
FIG. 13 A side cross sectional view showing a state where the door unit along with the lid member of the FOUP are moved away from the opening portion as compared with the state shown in FIG. 10.
Figure 14:
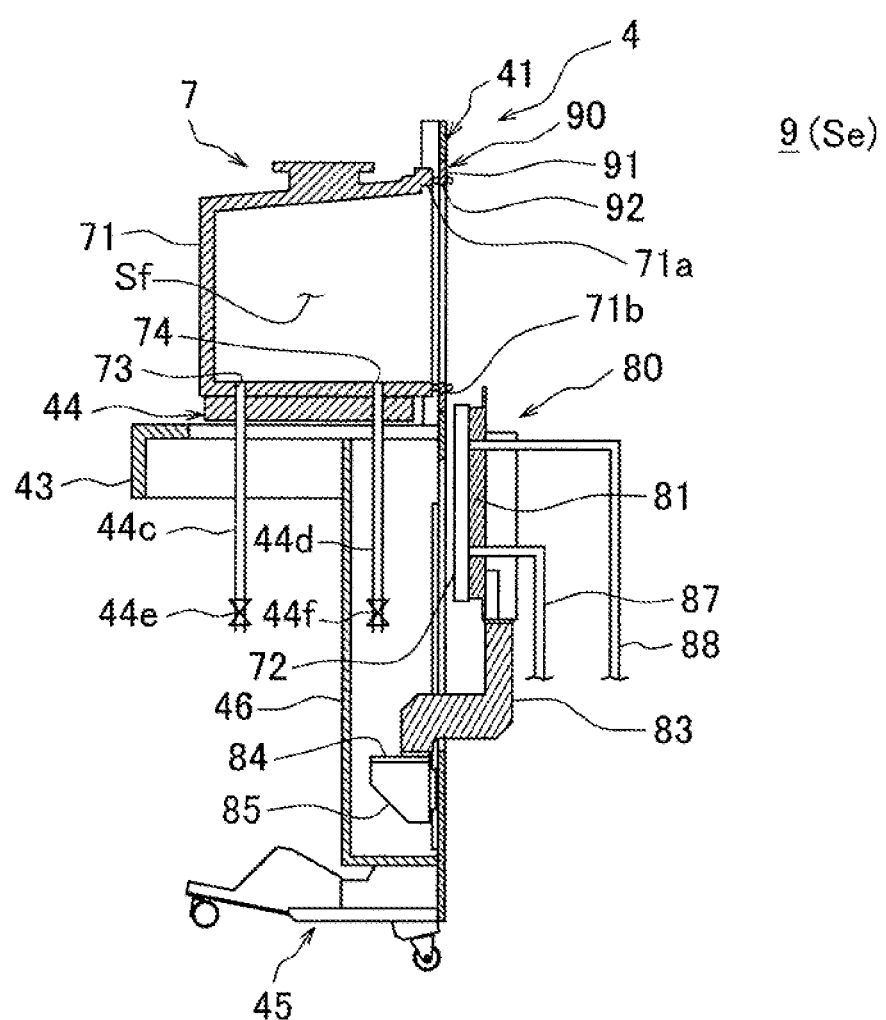
FIG. 14 A side cross sectional view showing a state where the door unit along with the lid member of the FOUP are moved downward from the state shown in FIG. 13.

In step S8, the door unit 81 and the lid member 72 are moved rearward along with the support frame 83, as shown in FIG. 13. This way the lid member 72 of the FOUP 7 is separated from the main body 71 thus opening the internal space Sf, and the door unit 81 is separated from the opening portion 92 to open the casing 3 (internal space Se). At this time, the abutting surface 71b of the FOUP 7 is firmly attached to the window unit 90 through the O-ring 94, and hence the flowing-out and flowing-in of the gas are restrained between the area between the casing 3 and the FOUP 7.

Further, since the pressure of the FOUP 7 is made high, there will be a flow of the gas from the internal space Sf of the FOUP 7 to the casing 3. This restrains particles and the like in the casing 3 from entering into the FOUP 7, and keeps the inside of the FOUP 7 clean. It should be noted that continuous supply of the gas at a low flow rate through the second gas injection nozzle 44c is also suitable for restraining the particles from entering. The pressure adjustment is ended thereafter.

In step S9, the door unit 81 and the lid member 72 are moved downward along with the support frame 83, as shown in FIG. S14. This largely opens the rear of the opening 71a serving as an outlet/inlet port of the FOUP 7, thus enabling conveyance of a wafer W between the FOUP 7 and the EFEM 1. Since the mechanism for moving the door unit 81 is entirely covered by the cover 46, the gas inside the casing 3 is restrained from leaking outside.

The operation at the time of opening the opening 71a of the FOUP 7 is thud described above. To close the opening 71a of the FOUP 7, the above described operations are performed in a reversed order. However, in an actual application of the door operation system, the above steps S6 and S7 may be omitted, provided that there is no problem in the pressure of the internal space Sf, the oxygen concentration, and the humidity, and the like at the time of closing the opening 71a of the FOUP 7.

By repeating the above operations, the O-rings 94 and 96 are resiliently abutted to the lid member 72 or the door unit 81, which may lead to occurrence of new particles. Such particles are however moved downward by the downward flow formed inside the casing 3, when the lid member 72 or the door unit 81 is opened. Therefore, the particles do not get on the surface of a wafer W, keeping the surface of the wafer W in a clean state.

Characteristics of Load Port of the Present Embodiment

The load ports 4 of the present embodiment has the following characteristics.

With the load port 4 of the present embodiment, even if the lid member 72 of the FOUP 7 is inflated towards the base 41, the FOUP 7-side end surface of the door unit 81 is positioned closer to the conveyance space 9 than the FOUP 7-side end portion of the first seal member 94, when the FOUP 7 is attached to the opening portion 92. Therefore, the lid member 72 and the door unit 81 do not contact each other. This prevents the lid member 72 from contacting the door unit 81 and scattering fragments, and keeps the space surrounding the load port 4 clean. Further, it is possible to restrain an impact of contact from stirring up the dusts on the door unit 81, or from shaking the FOUP 7 to stir up the dusts at the bottom portion of the FOUP 7 or deviate the position of accommodated article from the proper position.

In the load port 4 of the present embodiment, the FOUP 7-side end surface of the door unit 81 is at least partially positioned closer to the conveyance space 9 than the FOUP 7-side end portion of the first seal member 94 which is clamped and pressed against the base 41. Therefore, it is possible to reliably prevent contact of the lid member 72 with the door unit 81, while the FOUP 7 is attached to the opening portion.

With the load port 4 of the present embodiment, it is possible to reliably prevent the lid member 72 from contacting the door unit 81, even if the lid member 72 of the FOUP 7 is inflated towards the base 41.

Characteristics of Door Operation System of the Present Embodiment

The door operation system of the present embodiment has the following characteristics.

This door operation system or the load port 4 of the present embodiment includes: the first gas injection nozzle 87 configured to inject gas into the sealed space Sd formed between the FOUP 7 and the door unit 81 while the FOUP 7 is in contact with the opening portion 92 via the first seal member 94, i.e., while the FOUP 7 is attached to the opening portion 92, and the first gas discharge nozzle 88 configured to discharge gas from the sealed space Sd. With this, it is possible to remove the atmospheric air between the FOUP 7 and the door unit 81 and fill in the nitrogen gas (purge), while the FOUP 7 is attached to the opening portion 92. Therefore, atmospheric air between the FOUP 7 and the door unit 81, which contains oxygen, moisture, particles and the like that may cause a change in the characteristics of the wafer W such as oxidation of the wafer W is prevented from entering the conveyance space 9 or the FOUP 7 when the door unit 81 is opened. In other words, oxygen, moisture, and particles in the sealed space Sd can be eliminated before opening the sealed space Sd by opening the lid member 72 of the FOUP 7. As a result, oxygen and the like do not leak into the FOUP 7 or the conveyance space 9 when the lid member 72 is opened, which stakes it possible to maintain the cleanliness of the inside of the FOUP 7 and the conveying space 9.

In this door operation system of the present embodiment, the gas injection operation by the first gas injection nozzle 87 and the gas discharge operation by the first gas discharge nozzle 88 are repeated. Therefore, it is possible to reliably remove the atmospheric air between the FOUP 7 and the door unit 81 and fill in a gas.

In the door operation system of the present embodiment, when clamping the FOUP 7 to the base 41, the FOUP 7 is moved towards the door unit 81 from the state where the door unit 81 and the lid member 72 are apart from each other. This way, the sealing performance between the FOUP 7 and the base 41 through the O-ring 94 is improved.

In the door operation system of the present embodiment, the internal space Sf of the FOUP 7 and the sealed space Sd are in communication with each other, when the lid member 72 of the FOUP 7 is released. At this time, a large pressure difference between P1 and P2 increases the flow rate of the gas moving between the FOUP 7 and the sealed space Sd, which may stir up particles accumulated on the bottom portion of the FOUP 7 thus contaminating the wafers W. To address this, the P1 and P2 are controlled to be approximate each other, to reduce an amount of gas moving between the FOUP 7 and the sealed space Sd. With this, scattering of the particles is restrained, and hence contamination of the wafers W is prevented.

With this load port 4 having the door operation system of the present embodiment, the lid member 72 of the FOUP 7 is reliably detached at the time of opening the opening portion 92, and the lid member 72 is attached at the time of closing the opening portion 92. Therefore, each operation is swiftly carried out.

Thus, the embodiment of the present invention is described hereinabove. However, the specific structure of the present invention shall not be interpreted as to be limited to the above described embodiment. The scope of the present invention is defined not by the above embodiment but by claims set forth below and shall encompass the equivalents in the meaning of the claims and every modification within the scope of the claims.

In the above-described embodiment, gas-purge is performed in step S6 shown in FIG. 19, by having the first gas injection nozzle 87 supply nitrogen gas to the sealed space Sd, and having the first gas discharge nozzle 88 discharge gas from the sealed space Sd. However, the present invention is not limited to this, and the first gas discharge nozzle 88 may perform discharge for reducing the pressure. Specifically, after the atmospheric air in the sealed space Sd is sucked out by the first gas discharge nozzle 88 to reduce the pressure, the first gas injection nozzle 87 supplies nitrogen gas. This way, a gas is filled in the sealed space Sd efficiently.

Figure 27:
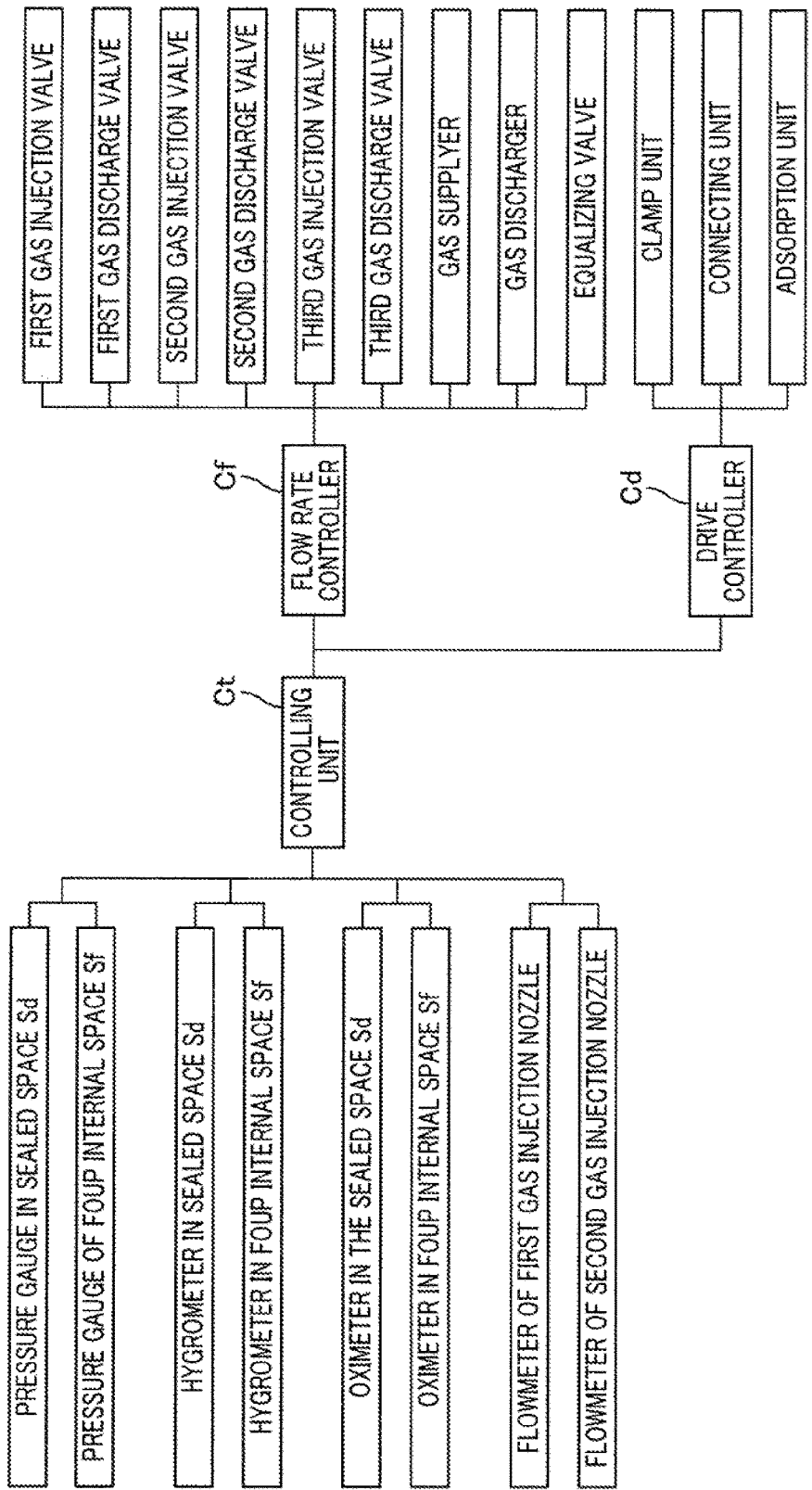
FIG. 27 A block diagram showing a modification of a connection state amongst a controlling unit, pressure gauges, valves.

In the above-described embodiment, the controlling unit Ct, the flow rate controller Cf, the drive controller Cd are installed in the EFEM 1. However, the present invention is not limited to this, and the controlling unit Ct, the flow rate controller Cf, and the drive controller Cd may be partially or entirely installed in the load port 4. In this case, the load port 4 is provided with a receiver unit configured to receive signals from a superordinate computer such as a controller of the EFEM 1. In cases of installing the controlling units in the load port 4, the input end of the controlling unit Ct is connected to the pressure gauges, the hygrometers, and oximeters for the sealed space Sd and the internal space Sf of the FOUP 7, and connected to the flowmeters of the first gas injection nozzle and the second gas injection nozzle, as shown in FIG. 27.

In the above-described embodiment, the pressure P1 of the internal space Sf and the pressure P2 of the sealed space Sd are approximated with each other in step 7 shown in FIG. 19. However, the present invention is not limited to this, and where the pressure inside the conveyance space 9 is P3, the pressures P1, P2, and P3 may be approximated with one another. Specifically, based on one of P1, P2, and P3, the rest of two pressures may be adjusted. In this case, the tune taken for adjusting the pressure is shortened by adjustment such that P2 and P3 approximate the pressure P1 of the internal space Se of the casing whose volume is largest amongst the sealed space Sd, the internal space Sf of the FOUP, and the internal space Se of the casing. Alternatively, it is possible to control the pressures so that the P1, P2, and P3 approximate a predetermined pressure value. The space sf of the FOUP 7, the sealed space Sd, and the conveyance space 9 are in communication with one another, when the door unit 81 opens the opening portion 92. At this tune, a large pressure difference amongst each space increases the flow rate of the gas moving amongst the spaces, which may stir up particles in the spaces. To address this, the P1, P2, and P3 are controlled to be approximate one another, to reduce an amount of gas moving amongst the FOUP 7, the sealed space Sd, and the conveyance space 9. With this, scattering of the particles is restrained, and hence contamination of each space is prevented.

Further, instead of approximating the P1 and P2 with each other in step S7 it is possible to adjust the pressures so that the P1, P2, and P3 increases in this order. By controlling the pressures P1, P2, and P3 so that they increase in this order, the pressure difference between adjacent spaces out of the space Sf in the FOUP 7, the sealed space Sd, and the conveyance space 9 is reduced. This reduces the flow rate of gas moving between adjacent spaces, as compared to cases where pressure difference between adjacent spaces is large, when the door unit 81 opens the opening portion 92 to communicate spaces with one another. Therefore, an amount of gas moving amongst the sealed space Sd and the conveyance space 9 of the FOUP 7. With this, scattering of the particles is restrained, and hence contamination of each space is prevented.

In the above-described embodiment, the FOUP 7 is adopted as the container for conveying wafers. However, the wafer storage container is not limited to this, and MAC (Multi Application Carrier), H-MAC (Horizontal-MAC), FOSB (Front Open Shipping Box), and the like may be adopted. Further, the container is not limited to a wafer storage container, and the present invention is also applicable to a closed container that accommodates an article, such as an electronic component, which is conveyed with an inert gas filled in the container.

Further, in the above-described embodiment, the load port is attached to the EFEM. However, the present invention is also applicable to a sorter having a conveyance chamber for sorting accommodated articles in a container placed in a load port or exchanging an accommodating article in a container in a load port with an accommodated article stored in a container in another load port, and applicable to a processing apparatus itself serving as a conveyance chamber, to which the load port is attachable.

Figure 20A:
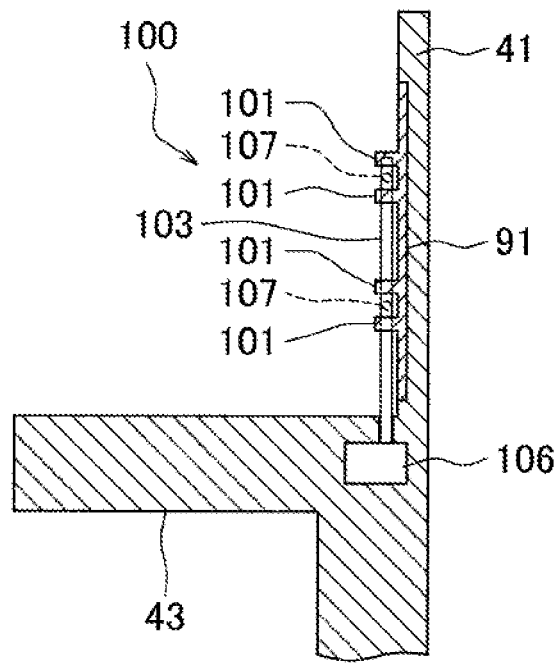
FIG. 20A is a cross sectional view showing a modification of the clamp unit.
Figure 20B:
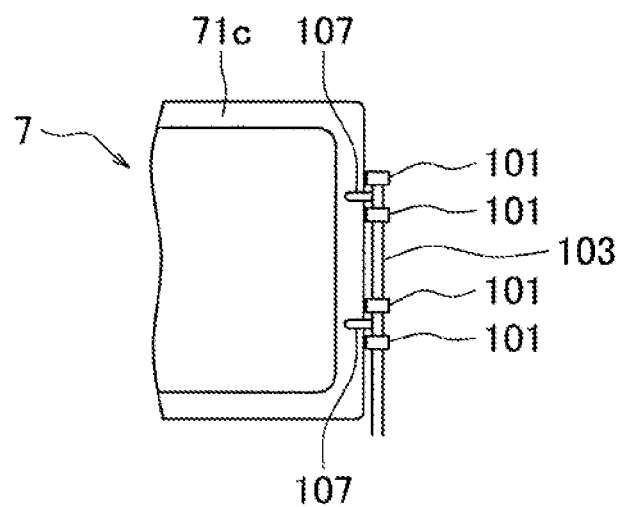
FIG. 20B is a front view showing the clamped state of FIG. 20A.
Figure 21B:
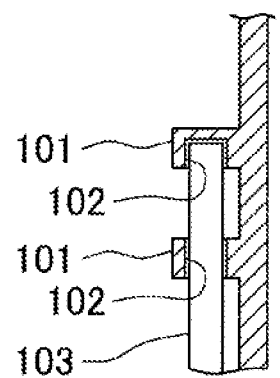
FIG. 21B is an enlarged cross sectional view showing a support piece shown in FIG. 21A.
Figure 22A:
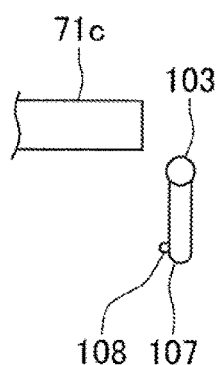
FIG. 22A is an enlarged plan view showing a state where the clamp unit is released.

The above-described embodiment adopted a clamp unit 50 having a cylinder 52: however, the clamp unit is not limited to this. As shown in FIG. 20A, a clamp unit 100 provided to a window frame 91 has a support piece 101, and a rod-shaped pivot member 103 which is pivotably supported by the support piece 101, and a motor 106 configured to drive the pivot member 103. The support piece 101 extends forward from the window frame 91, and pivotably supports the pivot member 103 at its hollow portion 102 (see FIG. 21B). The pivot member 103 has pressing pieces 107 which protrude from the upper end portion and a middle portion relative to the axial direction (see FIG. 20B). To the leading end of each of the pressing pieces 107, a pressing protrusion 108 is formed (see FIG. 22), and the flange portion 71c of the FOUP 7 is clamped through this pressing protrusion 108. The motor 106 embedded in the horizontal base portion 43 is connected to the lower end portion of the pivot member 103, and rotates the pivot member 103 around its axis.

Figure 21A:
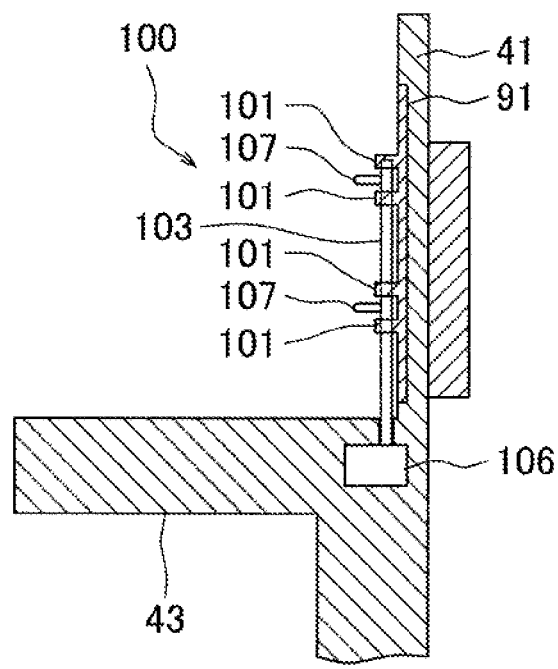
FIG. 21A is a cross sectional view showing state where the clamp unit of FIG. 20 is released.
Figure 22B:
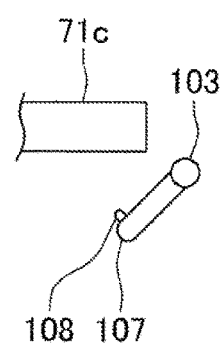
FIG. 22B is an enlarged plan view showing a state where the clamp unit is in operation.
Figure 22C:
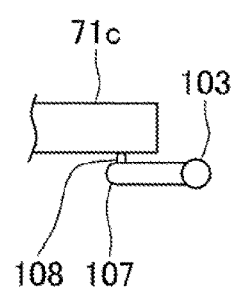
FIG. 22C is an enlarged plan view showing a clamped state.

As shown in FIG. 21A, during an unclamped state, the pressing piece 107 extends horizontally forward so as to be perpendicular to the window frame 91 (see also FIG. 22A)). When the motor 106 drives and rotates the pivot member 103 from this state, the pressing piece 107 rotates around the axis of the pivot member 103 as shown in FIG. 22B. By further rotating the pivot member 103, the pressing piece 107 presses the flange portion 71c through the pressing protrusion 108, thereby clamping the FOUP 7 (see also FIG. 20B). It should be noted that an air-driven cam and the like may be adoptable in place of the motor 106 as a driving unit for rotating the pivot member 103.

With the clamp unit 100 structured as above, it is possible to reduce the thickness of the clamp unit 100 relative to the front-rear direction thereof, and arrange the clamp unit 100 on the external space side. Therefore, interference with the wafer conveyance apparatus 2 operated in the conveyance space 9 is prevented.

In the above-described embodiment, the FOUP 7-side end surface 81c of the door unit 81 is entirely positioned closer to the conveyance space 9 than the FOUP 7-side end portion of the O-ring 94. However, the FOUP 7-side end surface 81c of the door unit 81 may only be partially positioned closer to the conveyance space 9 than the FOUP 7-side end portion of the O-ring 94.

Figure 23A:
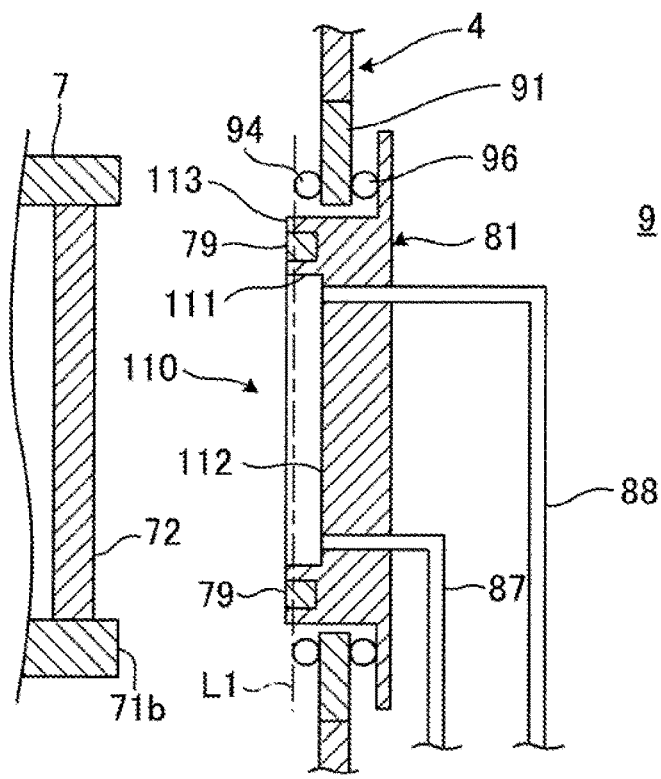
FIG. 23A is a cross sectional view showing a door unit of a modification having a recessed portion depressed toward a conveyance space.

As shown in FIG. 23A, a recess 111 depressed towards the conveyance space 9 is formed on an FOUP 7-side (front side) end surface 110 of the door unit 81. The bottom surface 112 of the recess 111 is positioned on the conveyance space 9-side of the virtual line L1 indicating the position of the FOUP 7-side end portion of the O-ring 94. In other words, the FOUP 7-side end surface 110 of the door unit 81 is at least partially (i.e., bottom surface 112) positioned closer to the conveyance space 9 than the FOUP 7-side end portion of the first seal member 94. This brings about effects similar to those of the above-described embodiment. At least partially herein indicates a part of the end surface 110 of the door unit 81 nearby the center portion or an area around the center portion. Further, the concept of the end surface 110 does not encompass the latch mechanism for fixing and releasing the lid member 72 to/from the FOUP 7, the adsorption unit 79 for fixing the lid member 72 to the door unit 81, and registration pins (not shown) for positioning the lid member 72 to the door unit 81. On the other hand, the outer circumferential surface 113 on the outer circumference of the end surface 110 is positioned on the FOUP 7-side of the virtual line L1, due to the type of the FOUP 7 and the lid member 72 and accuracy error at the time of manufacturing. It should be noted that the abutting surface 71b of the FOUP 7 is positioned closer to the conveyance space 9 than the lid member 72, the abutting surface, 71b abuts the O-ring 94 and forms the sealed space Sd.

Figure 23B:
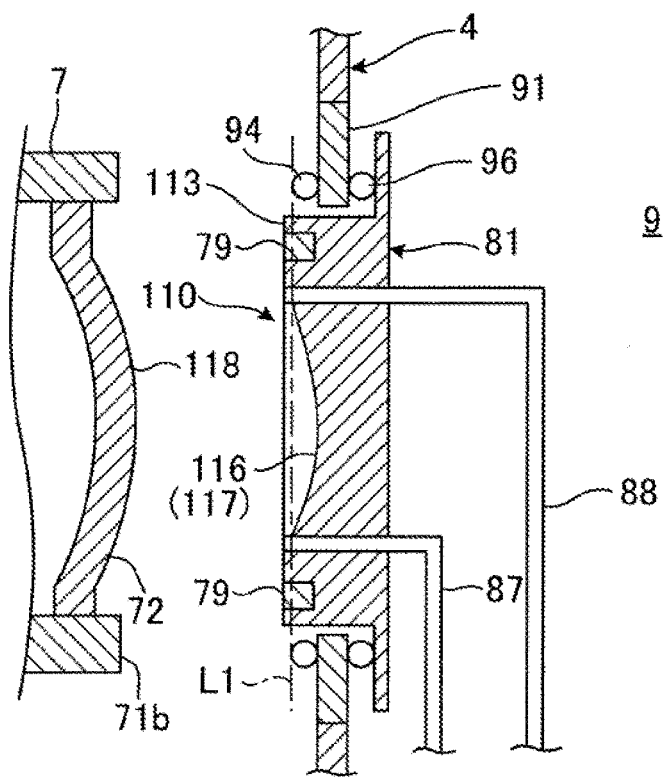
FIG. 23B is a cross sectional view showing a door unit of the modification having a curved surface formed in a shape bowed towards the side of the conveying space.

As shown in FIG. 23B, a curved surface 117 bowed towards the conveyance space 9 is formed on an FOUP 7-side (front side) end surface 116 of the door unit 81. This curved surface 117 is positioned on the conveyance space 9-side of the virtual line L1 indicating the position of the FOUP 7-side end portion of the O-ring 94. In other words, the FOUP 7-side, end surface 116 of the door unit 81 is mostly positioned closer to the conveyance space 9 than the FOUP 7-side end portion of the first seal member 94. This brings about effects similar to those of the above-described embodiment. On the other hand, the outer circumferential surface 113 on the outer circumference of the end surface 116 is positioned on the FOUP 7-side of the virtual line L1, due to accuracy error art the time of manufacturing. It should be noted that a part of the FOUP 7 (lid member 72) is bowed towards the conveyance space 9. Further, the abutting surface 71b of the FOUP 7 is positioned closer to the conveyance space 9 than the outer circumference of the lid member 72, the abutting surface 71b abuts the O-ring 94 and forms the sealed space Sd. As described, the shape of the curved surface 117 corresponds to an inflated surface 118 which is inflated by increasing the pressure inside the FOUP 7. Therefore, the FOUP 7 and the door unit 81 are reliably kept from contacting each other, even if the FOUP 7 inflates in various shapes.

Figure 24A:
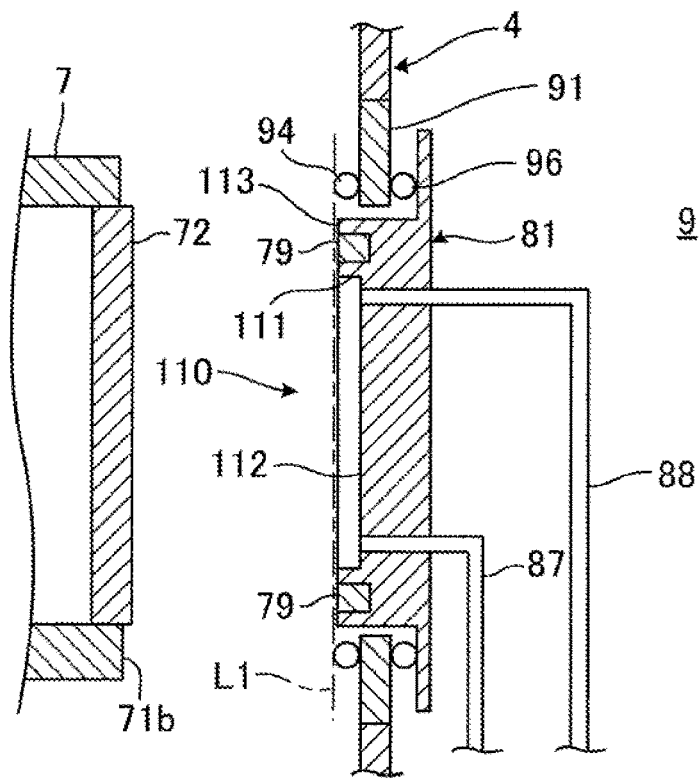
FIG. 24A is a cross sectional view showing a door unit of another modification having a recessed portion depressed toward a conveyance space.

As shown in FIG. 24A showing a modification of FIG. 23A, it is possible to adopt a structure, in which the outer circumferential surface 113 is positioned on the conveyance space 9-side of the virtual line L2, while the recess 111 is firmed on the end surface 110 of the door unit 81. In other words, the present modification deals with a case where the end surface 110 of the door unit 81 is entirely positioned closer to the conveyance space 9 than the FOUP 7-side end portion of the first seal member 94. This prevents interference of the lid member 72 with the door unit 81, even when the lid member 72 is protruding towards the conveyance space 9, while allowing the abutting surface 71b to abut the sealing member 94.

Figure 24B:
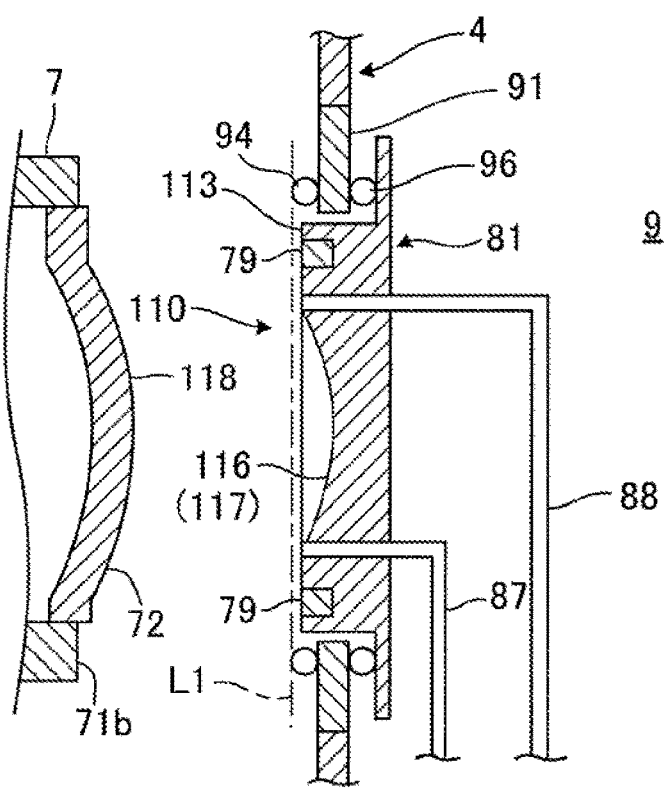
FIG. 24B is a cross sectional view showing a door unit of the other modification having a curved surface formed in a shape bowed towards the side of the conveying space.

As shown in FIG. 24B showing a modification of FIG. 23B, it is possible to adopt a structure in which the outer circumferential surface 113 is positioned on the conveyance space 9-side of the virtual line L2, while the curved surface 117 is formed on the door unit 81. In other words, the present modification deals with a case where the end surface 110 of the door unit 81 is entirely positioned closer to the conveyance space 9 than the FOUP 7-side end portion of the first seal member 94. This prevents interference of the lid member 72 having the inflated surface 118 with the door unit 81, even when the lid member 72 is protruding towards the conveyance space 9, while allowing the abutting surface 71b to abut the sealing member 94.

When the inflated lid member 72 is detached from the FOUP 7 by the door unit 81, the inflated lid member 72 may return to its original state. When the end surface 110 of the door unit 81 is entirely positioned closer to the conveyance space 9 than the first seal member 94 as in cases shown in FIG. 24A and FIG. 24B, the lid member 72 may not be properly fixed or attached to the FOUP 7, depending on the type of the latch mechanism or the adsorption unit. In view of this, these operations may performed in a position closer to the FOUP 7 by a predetermined distance, than the position of releasing the fix of the lid member 72 with respect to the FOUP 7 and detaching the lid member 72 from the FOUP 7. This predetermined distance is appropriately set based on the expansion rate of the lid member 72 and the type of the latch mechanism and the adsorption unit.

In the above-described embodiment, the pressures are adjusted by using the first gas injection nozzle 87, the second gas discharge nozzle 88, the second gas injection nozzle 44c, and the second gas discharge nozzle 44d, which are separate from one another; however, the present invention is not limited to this.

Figure 25:
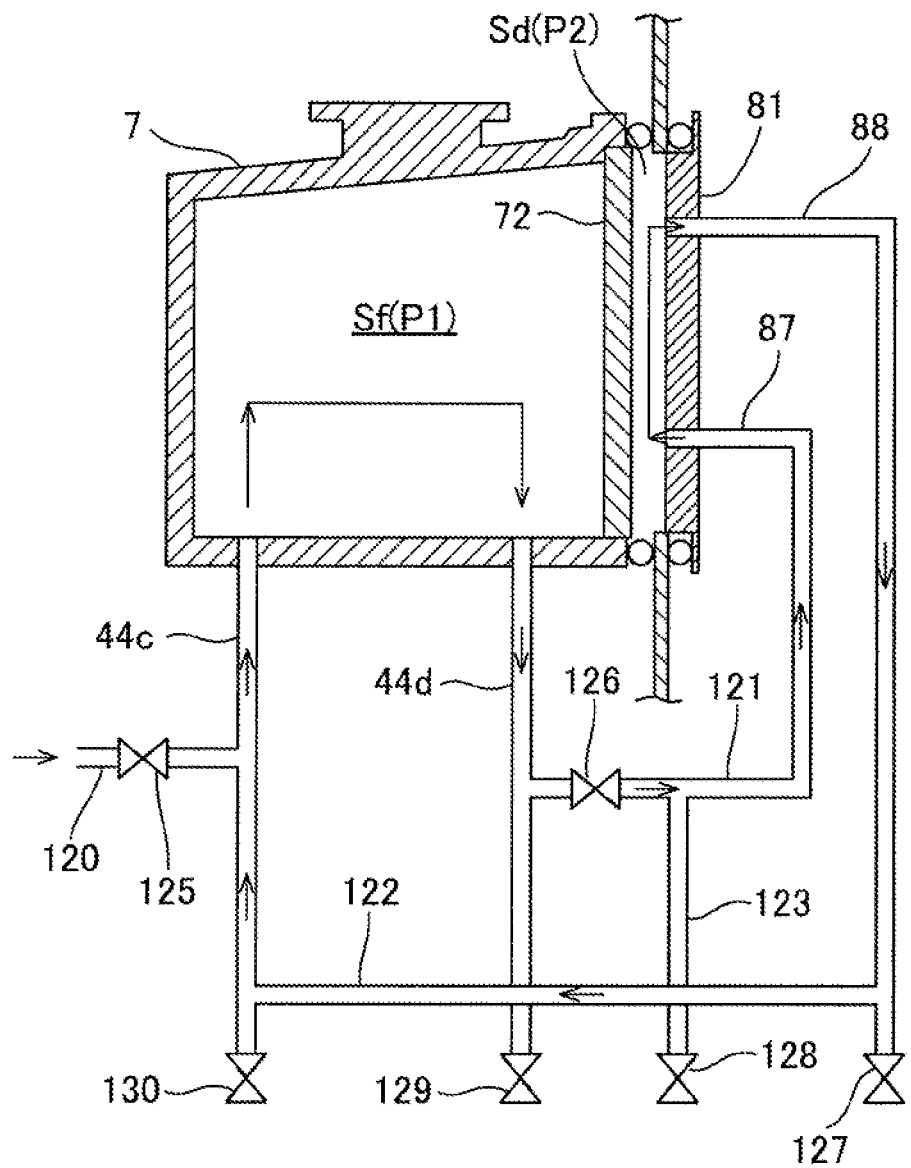
FIG. 25 A view showing a gas passage related to a modification, where the pressure P1 is higher than P2.
Figure 26:
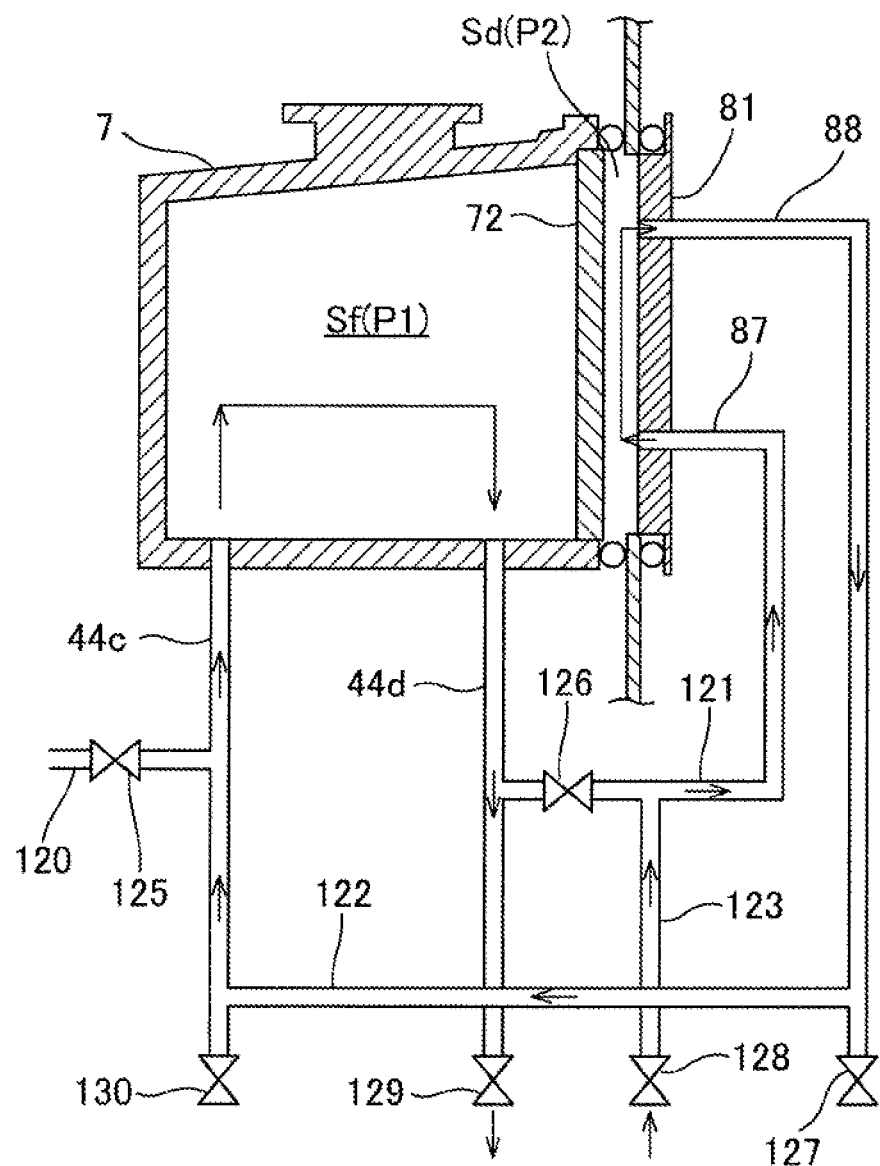
FIG. 26 A view showing a gas passage related to a modification, where the pressure P1 is lower than P2.

As shown in FIG. 25 and FIG. 26, a first supply nozzle 120 that supplies a gas is connected to the second gas injection nozzle 44c. The second gas discharge nozzle lid and the first gas injection nozzle 87 are connected with each other via an intermediate nozzle 121. Further, the second gas injection nozzle 44c and the second gas discharge nozzle 88 are connected with each other via a connection nozzle 122. A midway portion of the intermediate nozzle 121 is jointed with a second supply nozzle 123.

When the pressure P1 is higher than the P2, a first valve 125 and a second valve 126 are opened, and a third valve 127 to a sixth valve 130 are closed, as shown in FIG. 25. Therefore, the gas supplied from the first supply nozzle 120 flows into the FOUP 7 via the second gas injection nozzle 44c. The gas discharged from the FOUP 7 flows from the second gas discharge nozzle lid into the intermediate nozzle 121 via the second valve 126. The gas is then supplied to the sealed space Sd via the first gas injection nozzle 87, discharged from the second gas discharge nozzle 88, and sequentially flows into the connection nozzle 122 and the second gas injection nozzle 11c. In the second gas injection nozzle 44c, the gas merges with a gas newly supplied from the first supply nozzle 120. With the gas flowing the above-described passage, the pressure P1 of the FOUP 7 and the pressure P2 of the sealed space Sd approximate each other.

When the pressure P1 is lower than the P2, a fourth valve 128 and a fifth valve 129 are opened, and the first valve 125 to the third valve 127, and the sixth valve 130 are closed, as shown in FIG. 26. Therefore, the gas supplied from the second supply nozzle 123 via the fourth valve 128 flows into the sealed space Sd via the intermediate nozzle 121 and the first gas injection nozzle 87. The gas discharged from the sealed space Sd sequentially flows in the second gas discharge nozzle 88 and the connection nozzle 122, and then flows into the FOUP 7 via the second gas injection nozzle 44c. The gas discharged from the FOUP 7 is discharged from the second gas discharge nozzle 44d via the fifth valve 129. With the gas flowing the above-described passage, the pressure P1 of the FOUP 7 and the pressure P2 of the sealed space Sd approximate each other. It should be noted that, in adjustment of the pressures P1 and P3, only the third valve 127 arranged in the conveyance space 9 is opened. This communicates the FOUP 7 with the conveyance space 9 via the second gas injection nozzle 44c and the connection nozzle 122, thus enabling equalization of pressures.

In the above-described embodiment, the nitrogen was used as an example of the inert gas; however, the gas is not limited to this, and any intended gas such as a dry gas, argon gas, and the like are adoptable.

The above-described embodiment uses an O-ring as an example of the first seal member 94 and the second seal member 96; however, the seal members are not limited to these provided that sealing performance (sealability) is ensured.

As a seal member, a hollow seal member that expands or contracts by supply or discharge of fluid may be adopted in place of the O-rings. In cases of adopting this hollow seal member as the first seal member 94, the FOUP 7 is firmly attached to the base 41 by inflating the hollow seal member, after the FOUP 7 is abutted against the base 41. Further, it is preferable to inflate the hollow seal member after clamping by the clamp unit 50, to further improve the firm attachment. This way, the sealing performance is improved by crushing the hollow seal member with the fierce of the clamping, and the force of inflating the hollow seal member.

Figure 28:
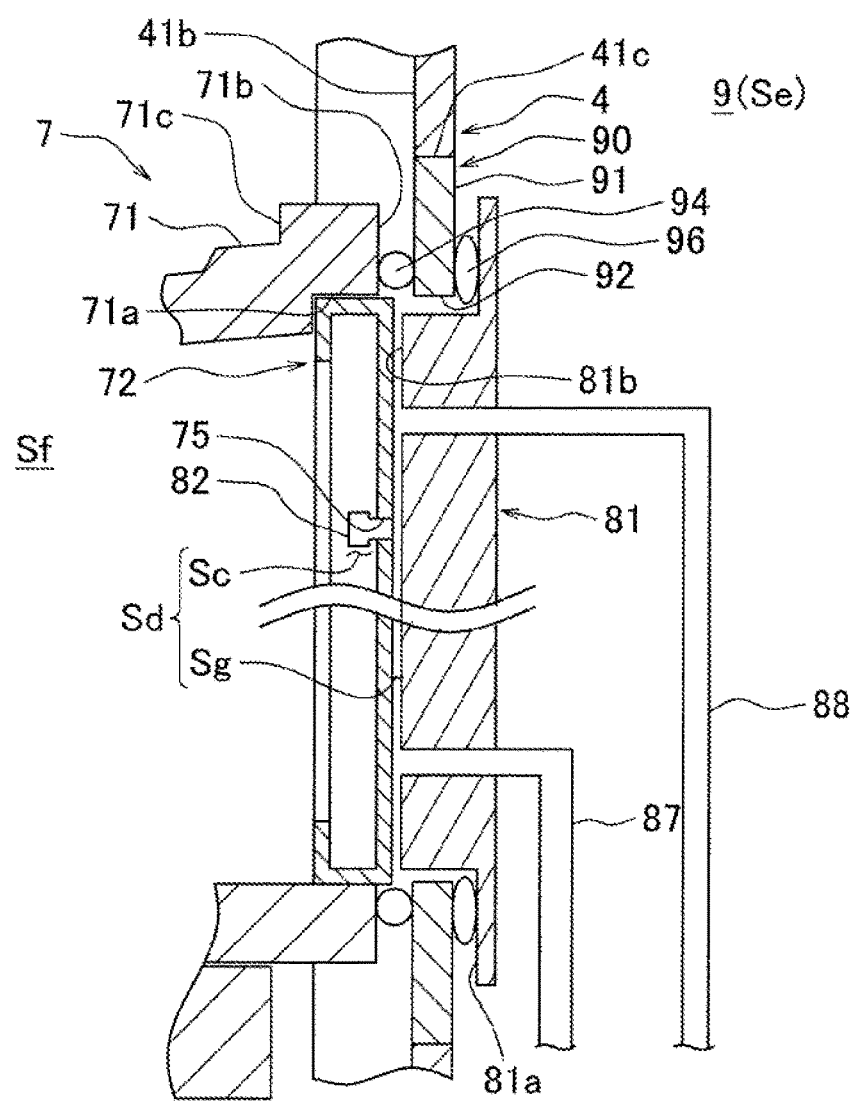
FIG. 28 A partially enlarged cross sectional view showing a modification in which the door unit is advanced towards the lid member of the FOUP, from the state of FIG. 11.

The above-described embodiment deals with a case where the FOUP 7 is moved towards the door unit S1, when clamping the FOUP 7 to the base 41, in step S4. Instead of this, it is possible to move the door unit 81 forward to the lid member 72, from a state where the door unit 81 and the lid member 72 are separated, after formation of the sealed space Sd (see FIG. 28). This forward movement is for bringing the door unit 81 and the lid member 72 closer to each other and to bring the lid member 72 into an unlatched state. Therefore, the door unit 81 may be moved forward to an extend that leaves a space between the lid member 72, or to an extent that the door unit 81 contacts the lid member 72. When the door unit 81 is moved forward to the lid member 72, the O-ring 96 is pressed and elastically deformed, thereby maintaining the sealed state of the sealed space Sd.

Figure 29:
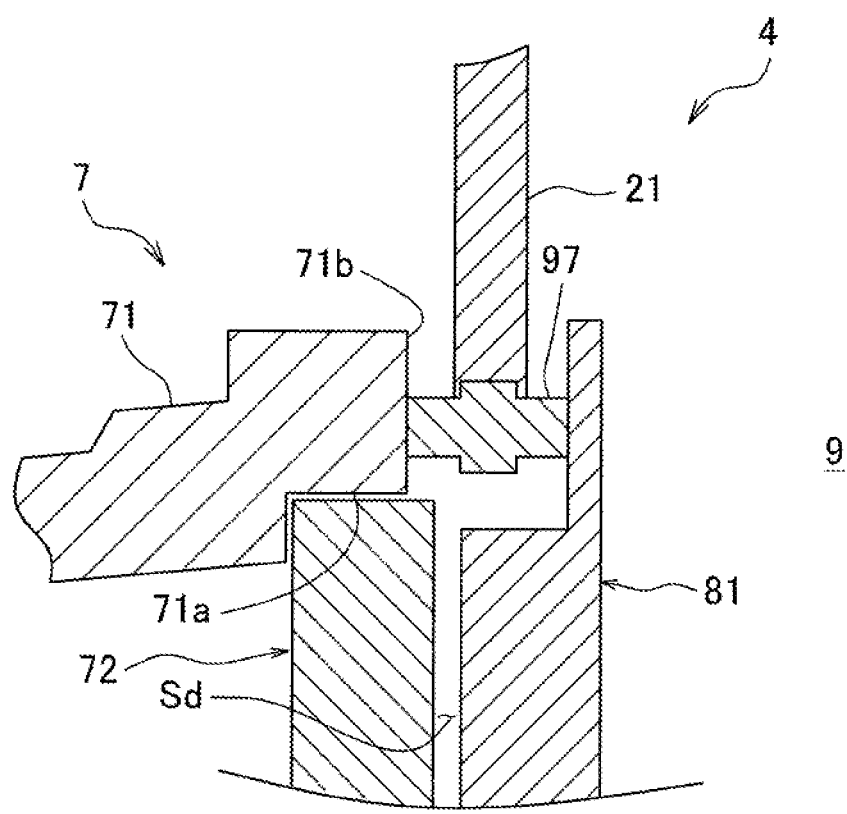
FIG. 29 A cross-sectional view showing a modification in which two O-rings are integrated.

In the above-described embodiment, the sealed space Sd is formed by the base 41, the O-rings 94 and 95, the lid member 72, and the door unit 81. However, by adopting an O-ring 97 which is two O-rings 94 and 95 formed in one piece (see FIG. 29), the sealed space Sd may be formed by the O-ring 97, the lid member 72, and the door unit 81.

REFERENCE SIGNS LIST 3 casing
7 FOUP (container)
9 conveyance space
41 base
50 clamp unit (clamp)
72 lid member
81 door unit (door)
87 first gas injection nozzle (first gas injection unit)
88 first gas discharge nozzle (first gas discharge unit)
92 opening portion
94 O-ring (first seal member)
96 O-ring (second seal member)
Sd sealed space

The invention claimed is:

1. A load port, comprising:
a base constituting a part of a wall separating a conveyance space from an external space;
an opening portion provided in the base,
a door configured to open and close the opening portion and to fix and release a lid member with respect to a container filled with an inert gas and accommodating articles therein;
a first seal member for sealing between the base and the container;
wherein
a container-side end surface of the door is at least partially positioned closer to the conveyance space than a container-side end portion of the first seal member,
the load port further comprising clamp units configured to press the container toward the base while the container is attached to the opening portion, the clamp units being provided at two parts on each of both sides of the opening portion,
an end surface of the door, which is to face the container, has a recess depressed towards the conveyance space, and
the shape of the recess corresponds to an inflated surface of the lid member inflated by increasing the pressure inside the container.

2. The load port according to claim 1, comprising:
a second seal member for sealing between the base and the door;
a sealed space defined by the base, the first seal member, the second seal member, the lid member, and the door while the container is in contact with the base, and while the door abuts the base via the second seal member,
wherein
when the container is clamped to the base, the container is moved towards the door from a state in which the door and the lid member are separate from each other.

3. The load port according to claim 1, comprising:
a second seal member for sealing between the base and the door;
a sealed space defined by at least the first seal member, the second seal member, the lid member, and the door while the container is in contact with the opening portion via the first seal member; and
a first gas injection unit configured to inject a gas into the sealed space.

4. The load port according to claim 1, wherein
the first gas injection unit configured to inject the gas into the sealed space penetrates the door in a thickness direction and communicates with the sealed space.

5. A load port, comprising:
a base constituting a part of a wall separating a conveyance space from an external space;
an opening portion provided in the base;
a door configured to open and close the opening portion and to fix and release a lid member with respect to a container accommodating therein an article;
a first seal member for sealing between the base and the container; and
a gas nozzle by which gas is supplied from a bottom portion of the container to inside of the container,
wherein
the gas is injected into the container through the gas nozzle and the lid member of the container is inflated toward the door due to pressure increase, and a container-side end surface of the door is at least partially positioned closer to the conveyance space than a container-side end portion of the first seal member.

6. The load port according to claim 5, wherein
the container includes clamp units configured to press the container toward the base while the container is attached to the opening portion, and
two or more of the clamp units are provided on each of both sides of the opening portion.

7. The load port according to claim 5, comprising:
a second seal member for sealing between the base and the door;
a sealed space defined by at least the first seal member, the second seal member, the lid member, and the door while the container is in contact with the opening portion via the first seal member; and
a first gas injection unit configured to inject a gas into the sealed space.

8. The load port according to claim 7, wherein
the first gas injection unit configured to inject the gas into the sealed space penetrates the door in a thickness direction and communicates with the sealed space.

* * * * *